(12) United States Patent
Tanaka et al.

(10) Patent No.: US 7,334,923 B2
(45) Date of Patent: Feb. 26, 2008

(54) VEHICLE REARVIEW MIRROR INCLUDING A LIGHT-EMITTING DIODE APPARATUS

(75) Inventors: Yoshiharu Tanaka, Aichi-ken (JP); Akihiro Misawa, Aichi-ken (JP); Toshinori Takahashi, Aichi-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 192 days.

(21) Appl. No.: 10/813,633

(22) Filed: Mar. 31, 2004

(65) Prior Publication Data

US 2004/0257790 A1  Dec. 23, 2004

(30) Foreign Application Priority Data

Mar. 31, 2003  (JP)  ............................. 2003-096752
Mar. 31, 2003  (JP)  ............................. 2003-096757

(51) Int. Cl.
*B60Q 1/32*  (2006.01)
*F21V 7/04*  (2006.01)

(52) U.S. Cl. ..................... 362/494; 362/545; 362/511; 362/245

(58) Field of Classification Search ............... 362/494, 362/545, 245, 247, 612, 800, 311, 29, 559; 257/98
See application file for complete search history.

(56) References Cited

U.S. PATENT DOCUMENTS 2,580,014 A * 12/1951 Gazda .................. 362/494
3,774,021 A * 11/1973 Johnson ................ 362/27
4,323,951 A *  4/1982 Pasco .................. 362/27
4,638,343 A *  1/1987 Althaus et al. ............ 257/98
5,865,529 A *  2/1999 Yan .................... 362/327
6,099,153 A *  8/2000 Zimmermann et al. ..... 362/494
6,183,099 B1 *  2/2001 Garay et al. ............ 362/26
6,299,334 B1 * 10/2001 Schwanz et al. .......... 362/494
6,674,096 B2 *  1/2004 Sommers ................ 257/98
6,761,475 B2 *  7/2004 Perlo et al. .............. 362/511
6,769,798 B2 *  8/2004 Mishimagi ............... 362/494

(Continued)

FOREIGN PATENT DOCUMENTS

DE          200 13 330 U1    8/2000

(Continued)

OTHER PUBLICATIONS

German Office Action dated Jan. 17, 2007 with an English translation.

*Primary Examiner*—Jong-Suk (James) Lee
*Assistant Examiner*—Ismael Negron
(74) *Attorney, Agent, or Firm*—McGinn IP Law Group, PLLC

(57) ABSTRACT

A vehicle rearview mirror including a housing, a mirror, an LED that has a light emitting element and plane-radiates light in a direction nearly vertical to the optical axis of the light emitting element, and a light-guiding member in which at least the one LED is incorporated at a predetermined position. The light-guiding member has a light reflection surface that reflects light to be plane-radiated from the LED and that allows the reflected light to be radiated in a desired direction, and a light radiation surface that allows direct light to be directly emitted from the LED and the reflected light to be externally radiated by the light radiation surface.

23 Claims, 25 Drawing Sheets

U.S. PATENT DOCUMENTS

| | | | |
|---|---|---|---|
| 6,773,154 B2 * | 8/2004 | Desai | 362/541 |
| 2004/0027833 A1 | 2/2004 | Amano et al. | |
| 2005/0237766 A1 * | 10/2005 | Klettke | 362/612 |

FOREIGN PATENT DOCUMENTS

| | | |
|---|---|---|
| DE | 103 30 261 A1 | 1/2004 |
| EP | 0 945 673 A1 | 9/1999 |
| EP | 1 255 306 A2 | 11/2002 |
| JP | 2000-025519 | 1/2000 |

* cited by examiner

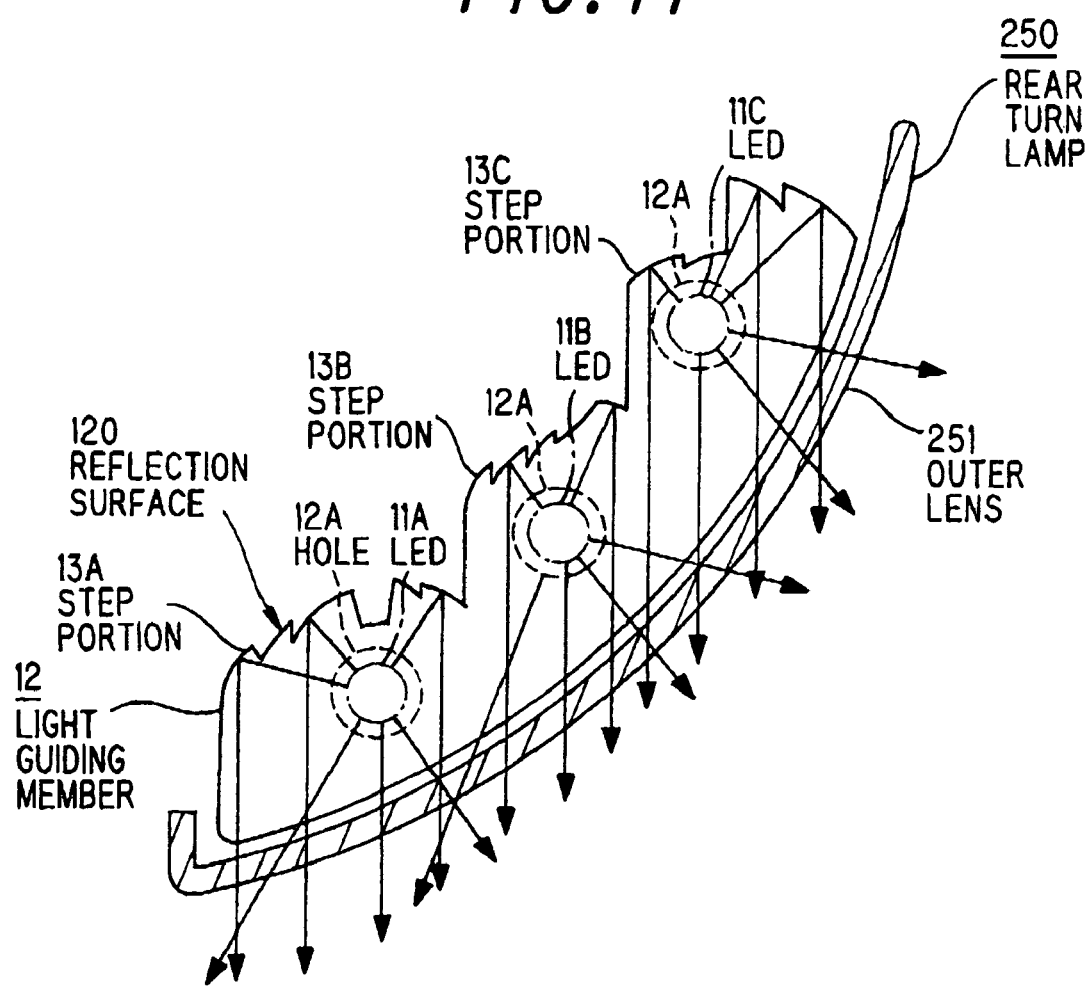

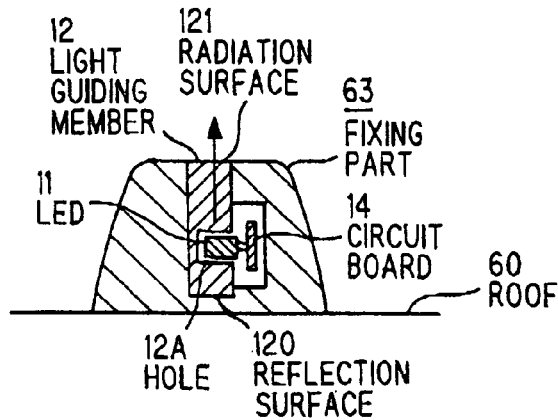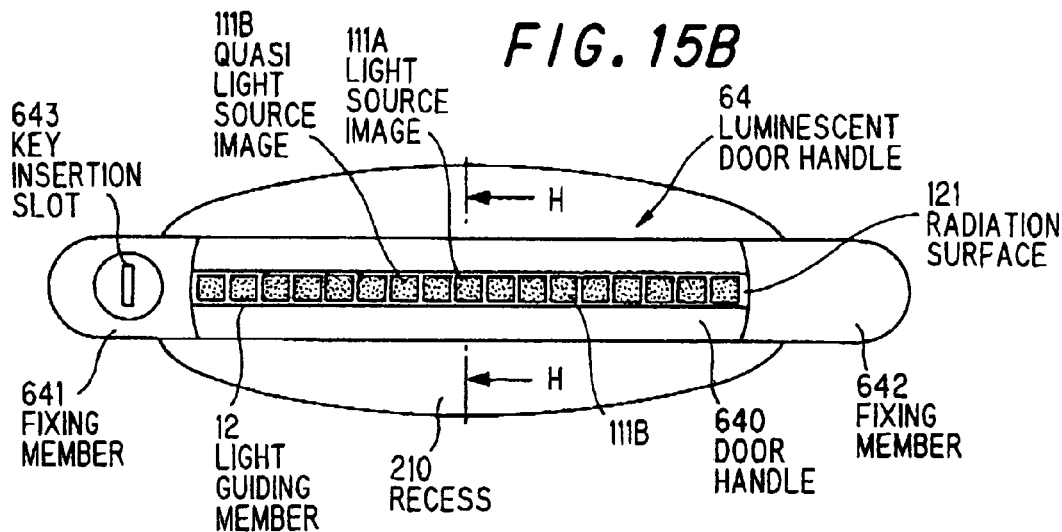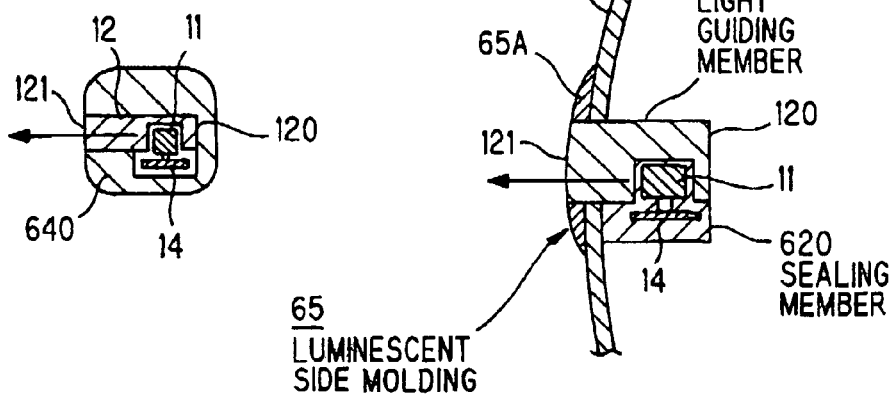

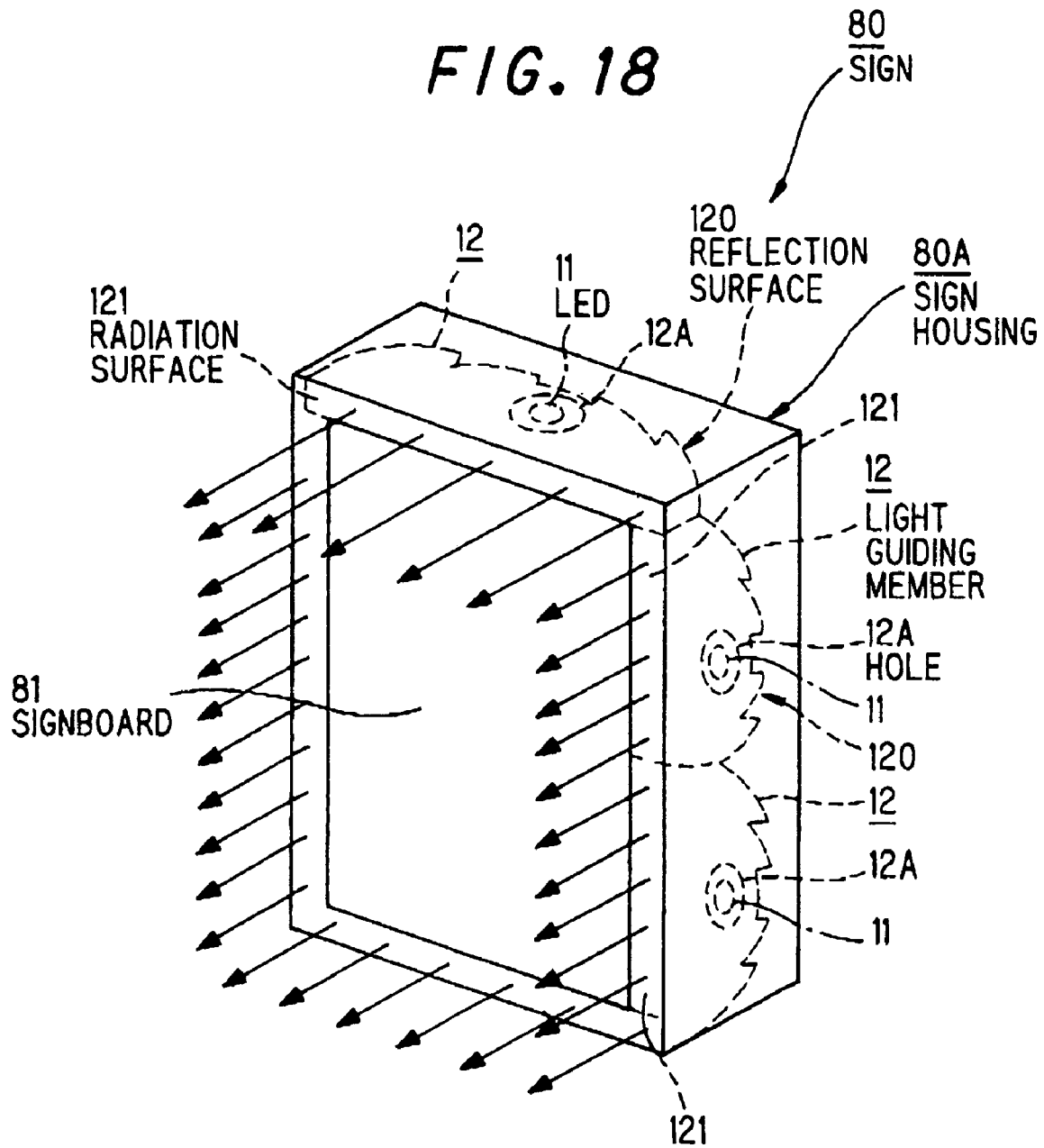

VEHICLE REARVIEW MIRROR INCLUDING A LIGHT-EMITTING DIODE APPARATUS

The present application is based on Japanese patent application Nos.2003-096752, 2003-096757 and 2004-73865, the entire contents of which are incorporated herein by reference.

BACKGROUND OF THE INVENTION

1. Field of the Invention

The invention relates to a luminescent indicator with LED used as a light source and a vehicle rearview mirror apparatus and, particularly, to a luminescent indicator and a vehicle rearview mirror apparatus that allow an improved visibility while offering reduced power consumption, long operating life and low-profiled body.

2. Description of the Related Art

In recent years, LED's (light emitting diodes) are applied to various apparatuses because they have a long operating life and reduced power consumption as compared to conventional bulbs. Since a luminescent indicator using LED has a small light-source size, it is frequently used as a light source for a unit that is subject to a limitation on its dimension.

On the other hand, the power consumption in various electronic devices is apt to increase due to enhancement in its performance and function. A certain ratio of people owns a plurality of television sets or personal computers at home. Further, as communication lines are sped up, the number of certain personal computers that have full-time access to the communication line increases. Therefore, although power consumption in a device itself is reduced, the total power consumption in using multiple devices simultaneously will be not negligible. Especially in lighting devices such as lamps, an increase in power consumption is significant.

Further, in view of environmental protection on global warming or air pollution, electric vehicles that use a motor as drive mechanism without discharging warming gas or hybrid cars that use a combination of motor and small engine are developed in place of vehicles that have a drive mechanism to use fossil fuel such as gasoline. However, even in such new vehicles, it is still important to reduce the power consumption of lighting devices so as to secure a longer cruising distance.

Vehicles such as automobiles and motorcycles are equipped with a rearview mirror apparatus that allows its driver to look backward circumstances. For example, in case of automobile, rearview mirror apparatuses are disposed on both sides of its front window or engine hood while projecting from the car width. Although the rearview mirror apparatus is attached projecting from the car width, it is not easy for a driver of oncoming car or a pedestrian to notice it in the night since it is relatively small. Therefore, a driver of oncoming car, pedestrian or bicycle rider may have a minor collision with the rearview mirror apparatus. Especially, a black rearview mirror apparatus must produce a worse visibility even when the body color is white or so.

Japanese patent application laid-open No.2000-25519 (herein referred to as "prior art 1") discloses a rearview mirror apparatus with a light (herein called a rearview mirror light) to indicate the projecting of rearview mirror apparatus to prevent the collision accident (ibid., FIGS. 1 and 3).

FIG. 1 is a cross sectional view showing the rearview mirror apparatus 100 disclosed in prior art 1. The rearview mirror apparatus 100 is attached to a door 200 on the right side of a car. The rearview mirror apparatus 100 is composed of: a housing body 101 that is attached to the door 200 and has an opening on the back side; a mirror 102 that is housed in the housing body 101 to close the opening; a support 103 that is disposed behind the mirror 102 to rotatably support the mirror 102 and fixed to the housing body 101; a L-shaped support board 104 that is disposed inside a front face 110a of the housing body 101; and bulbs 105a, 105b, 105c and 105d (composing the rearview mirror light) that are disposed at predetermined intervals on the support board 104.

The support 103 is connected through a semispherical member 103a to the back of mirror 102 and is fixed to the housing body 101. By pushing a desired part of the mirror 102, the mirror 102 can be adjusted to have a desired angle (backward viewable angle) while being rotated around the support 103.

The housing body 10 is made by molding transparent resin and its outer surface is coated with transparent paint that has the same color as the body when light is transmitted therethrough. The housing body 101 has an inner surface 101b with diamond-facets to diffuse radiated light.

The bulbs 105a to 105d are laterally disposed on the support board 104 to illuminate the front face 101a and side face 101c of housing body 101, Electric power is supplied to the bulbs 105a to 105d in conjunction with turn-on of small lamp. The number of bulbs may be arbitrarily varied although the four bulbs 105a to 105d are exemplified.

In operation, light radiated from the bulbs 105a to 105c is shed on the diffusion diamond-facets formed on the inner surface 101b of housing body 101, diffused there, then transmitted through the paint-coated layer on the housing body 101, radiated from the front face 111a to provide forward radiation light 106. Light radiated from the bulb 105d is shed on the side face 101c of housing body 101, then transmitted through the housing body 101 to provide lateral radiation light 107.

Thus, the rearview mirror light radiates the forward radiation light 106 and lateral radiation light 107, thereby allowing an oncoming car driver, pedestrian, bicycle rider, motorcycle rider or following car driver who is on the forward, side or backward to notice the rearview mirror apparatus 100. Thereby, the collision accident with the rearview mirror apparatus 100 can be prevented effectively.

However, the rearview mirror apparatus of prior art 1 has problems as described below.

(i) Since many bulbs are needed to illuminate the front face and side face of housing body, the power consumption must be increased to cause an increase in battery load.

(ii) Since the bulbs are attached to the support board through sockets, its depth is difficult to reduce. Thus, it is not easy for the rearview mirror apparatus to be low-profiled.

The above problems may be solved by using LED with reduced power consumption instead of bulb.

However, even when LED's as many as bulbs are provided, there occurs unevenness in light intensity in the entire lighting range of rearview mirror light since LED has a light intensity lower than bulb. Instead, when the number of LED's is increased to prevent the unevenness, the reduction effect of power consumption by using LED must be spoiled.

Japanese patent application laid-open No.2000-307807 (herein referred to as "prior art 2") discloses a linear light source unit that light emitted from LED is entered into a light-guiding member and then externally radiated being reflected on a groove provided on the light-guiding member. Its object is to offer a wider lighting even when using one LED.

In the linear light source unit, of light emitted from LED, light component to be, to the right and left side, separated by parabolic surface heads to the longitudinal direction of light-guiding member, being repeatedly subjected to total reflection at the second side surface and first side surface of light-guiding member. During the reflection, light entered to the first side surface with an incident angle smaller than its critical angle θ c is externally radiated. In this case, most of light to be irradiated to the surface of groove is reflected being diffused radially. Most of light to be emitted from LED and entered into the intermediate interface passes through the hole while being refracted at the interface, being entered into a plastic material again from the upper interface, then being radiated from the center of the first side surface of light-guiding member.

However, the linear light source unit of prior art 2 has the following problem. Since light is entered from the intermediate interface through the hole into a plastic material again, there occurs unevenness in light distribution since the external radiation property of light lowers when a factor, e.g. stain, to block the transmission of light exists in the hole.

SUMMARY OF THE INVENTION

It is an object of the invention to provide a luminescent indicator and a vehicle rearview mirror apparatus that allow a good light distribution in a wider range while offering reduced power consumption, long operating life and low-profiled body.

According to a first aspect of the invention, a luminescent indicator comprises:

an LED that includes a light emitting element and that plane-radiates light in a direction nearly vertical to the optical axis of the light emitting element; and a light-guiding member in which at least the one LED is incorporated at a predetermined position and which includes: a light reflection surface that reflects light to be plane-radiated from the LED and that allows the reflected light to be radiated in a desired direction; and a light radiation surface that allows direct light to be directly emitted from the LED and the reflected light to be externally radiated the light radiation surface.

According to a second aspect of the invention, a rearview mirror apparatus for looking the backward circumstances of a vehicle comprises:

a housing that includes a mirror disposed on its back side;

an LED that includes a light emitting element and that plane-radiates light in a direction nearly vertical to the optical axis of the light emitting element; and a light guiding member that is attached to the housing such that it is exposed in an opening formed at part of the outer surface of the housing and that houses at least the one LED at a predetermined position;

wherein the light-guiding member allows part of light radiated from the LED to be transmitted through and allows other part of light radiated from the LED to be reflected on its inner surface to be radiated in a desired direction.

According to a third aspect of the invention, a rearview mirror apparatus for looking the backward circumstances of a vehicle comprises:

a housing that includes a mirror disposed on its back side;

an LED that includes a light emitting element and that radiates light in the optical axis direction of the light emitting element and in a direction nearly vertical to the optical axis direction; and a reflector that is disposed along the shape of the housing at part of the outer surface of the housing and that has at least one reflection surface which allows light radiated from the LED disposed in the reflection surface to be reflected in the front or side direction of the vehicle.

BRIEF DESCRIPTION OF THE DRAWINGS

The preferred embodiments according to the invention will be explained below referring to the drawings, wherein:

FIG. 11 is a cross sectional view cut along the line E-E in FIG. 9 to show the rear turn lamp 250 in a third preferred embodiment of the invention;

FIG. 15A is a cross sectional view cut along the line G-G in FIG. 14 to show a roof rail in a seventh preferred embodiment of the invention;

FIG. 15B is a front view showing a luminescent door handle 64 in an eighth preferred embodiment of the invention;

FIG. 15C is a cross sectional view cut along the line H-H in FIG. 15B;

FIG. 15D is a cross sectional view cut along the line I-I in FIG. 14 to show a luminescent side molding 65 in a ninth preferred embodiment of the invention;

FIG. 18 is a perspective view showing a sign 80 in a twelfth preferred embodiment of the invention;

DETAILED DESCRIPTION OP THE PREFERRED EMBODIMENTS

First Embodiment

Figure 2:
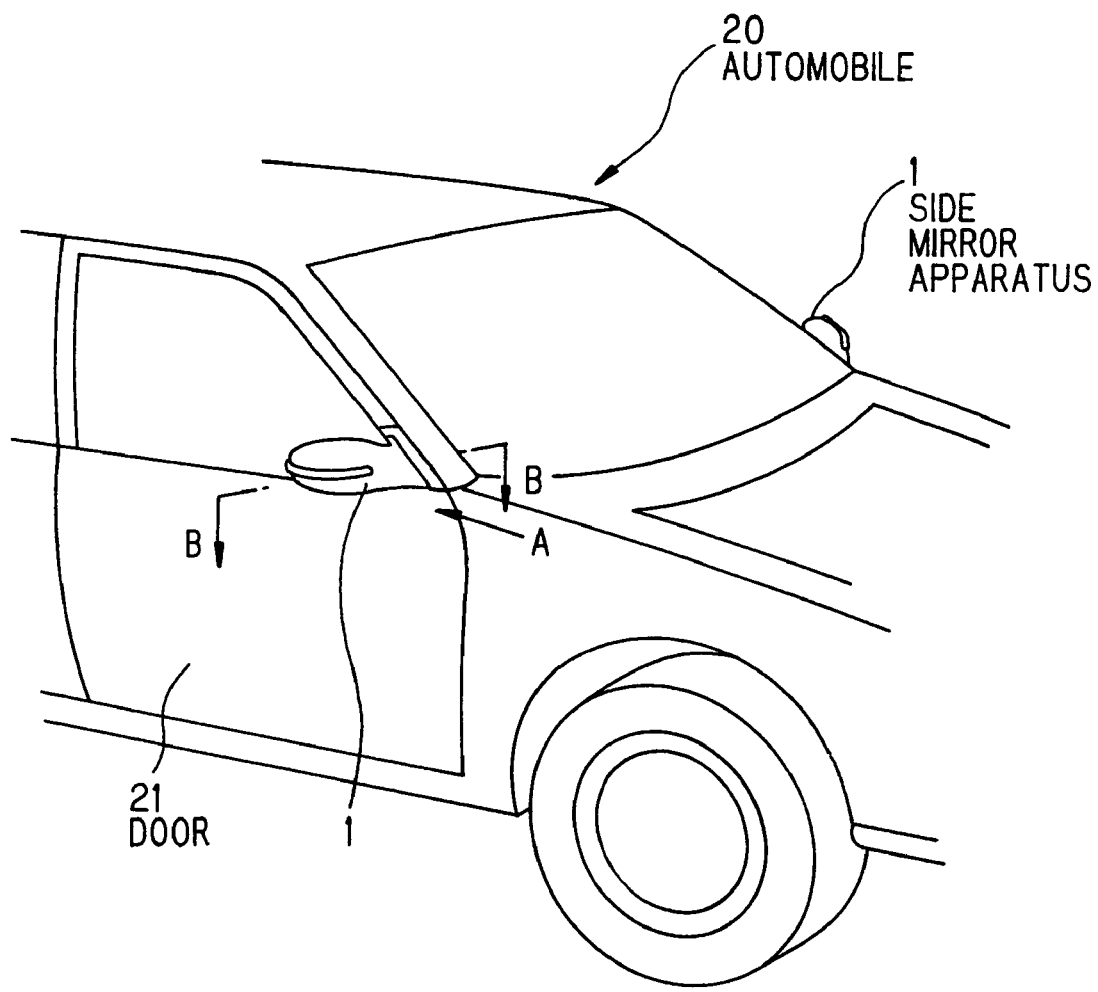
FIG. 2 is a perspective view showing part of automobile equipped with a rearview mirror apparatus in a first preferred embodiment of the invention.

FIG. 2 shows a rearview mirror apparatus 1 in the first preferred embodiment of the invention.

The rearview mirror apparatus 1 is attached onto a front door 21 of automobile 20.

Figure 3:
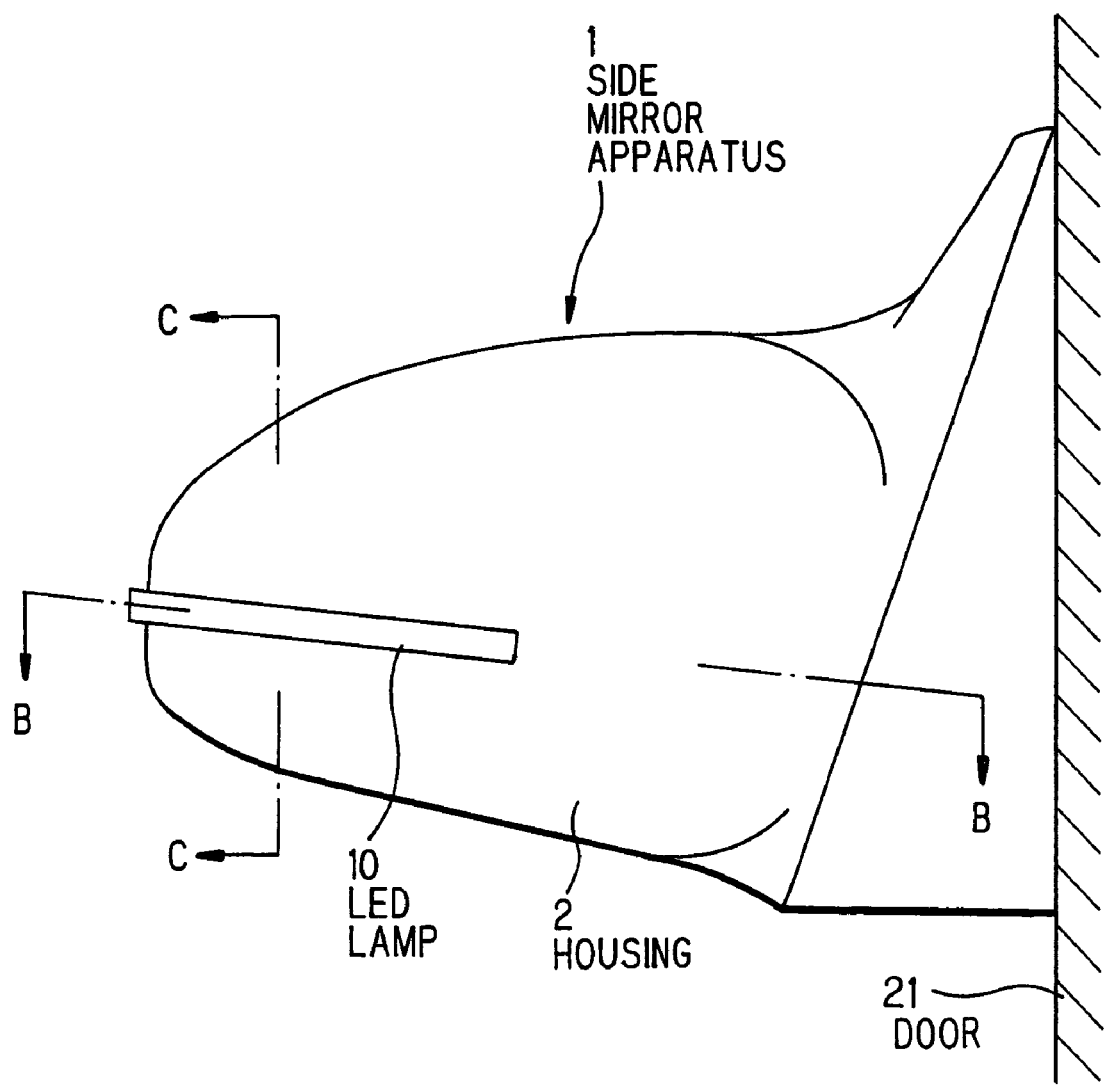
FIG. 3 is a front view showing the rearview mirror apparatus in the first embodiment.

FIG. 3 is a front view showing the rearview mirror apparatus 1 being viewed in a direction A arrowed in FIG. 2.

The rearview mirror apparatus 1 is composed of a housing 2 having a hollow structure made by resin molding, and an LED lamp 10 is disposed on the front-edge side thereof. The LED lamp 10 is designed such that it is integrated with the housing 2.

Figure 4:
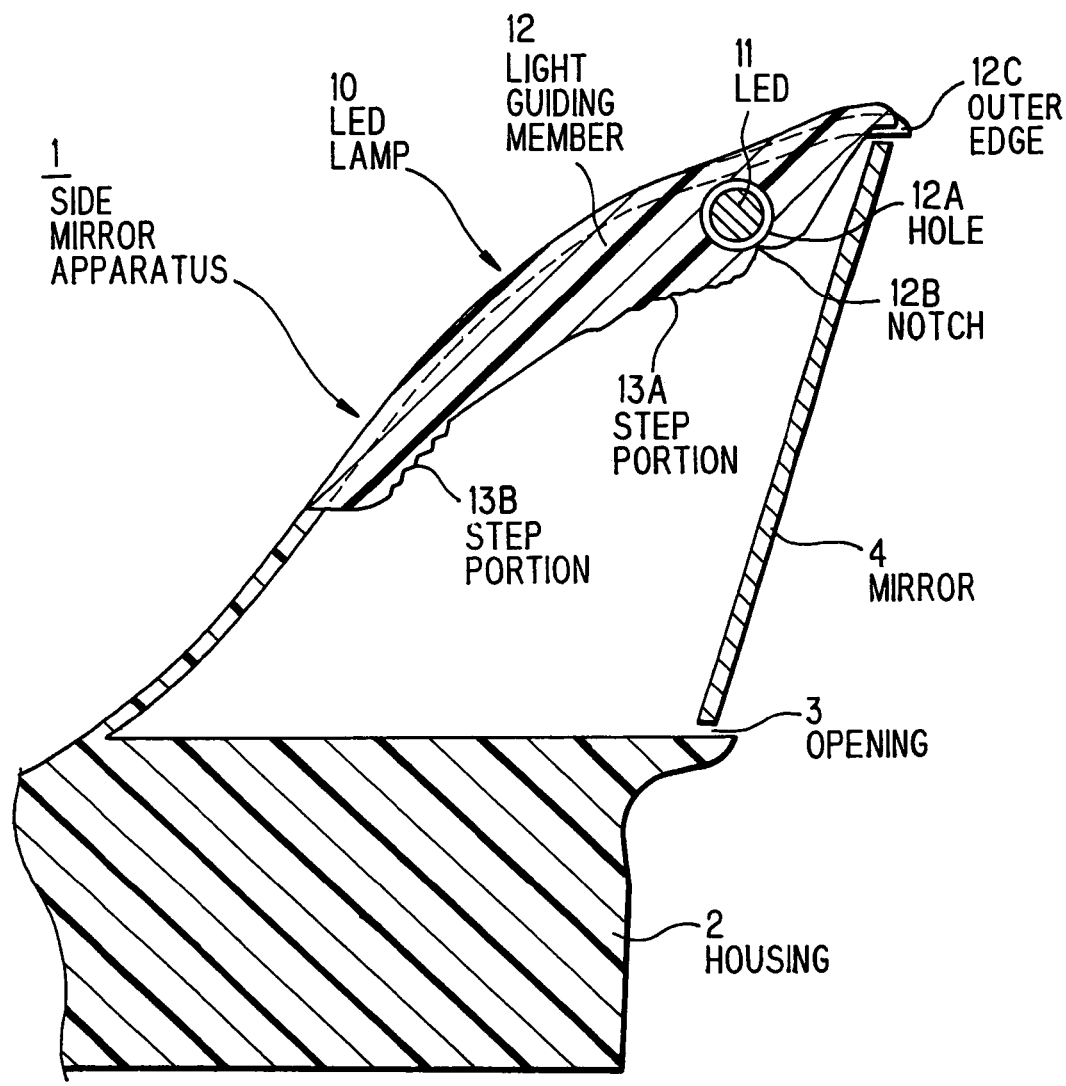
FIG. 4 is a cross sectional view cut along the line B-B in FIG. 3.

FIG. 4 is a cross sectional view cut along the line B-B in FIG. 3 to show the LED lamp 10 in FIG. 3.

Figure 1:
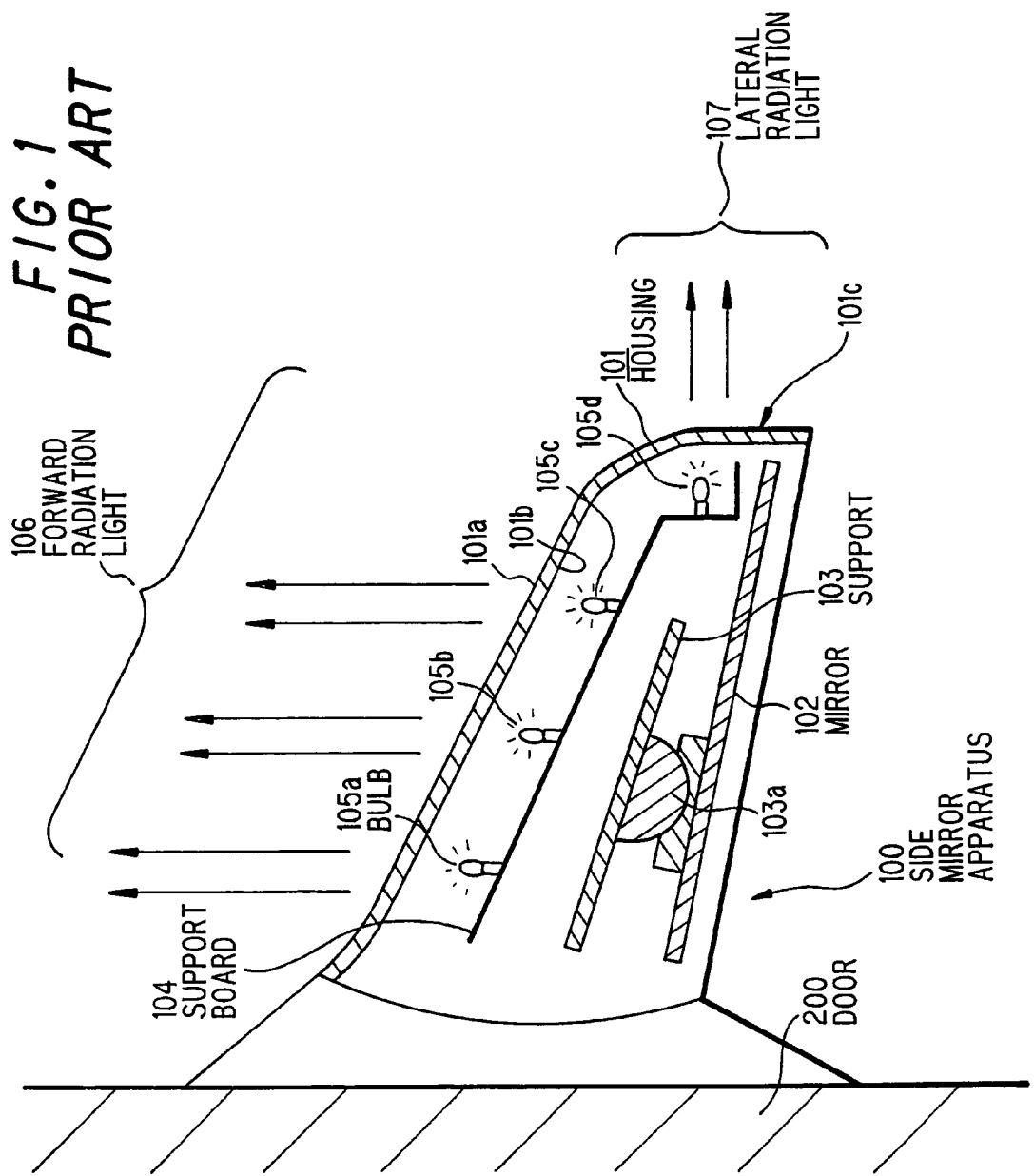
FIG. 1 is a cross sectional view showing the conventional rearview mirror apparatus disclosed in prior art 1.

An opening 3 is formed on the back side of the housing 2, and a mirror 4 is disposed to close the opening 3. The mirror 4 is rotatably fixed to a support member (not shown), for example, a support member with a rotation mechanism as shown in FIG. 1 or a support member with a motor-driven mechanism to be operated by a remote controller provided in the automobile.

The LED lamp 10 is composed of: a plane radiation type LED 11 as a light source; and a light-guiding member 12 to which the LED 11 is fitted and which guides light of the LED 11 to the front of vehicle.

Figure 5:
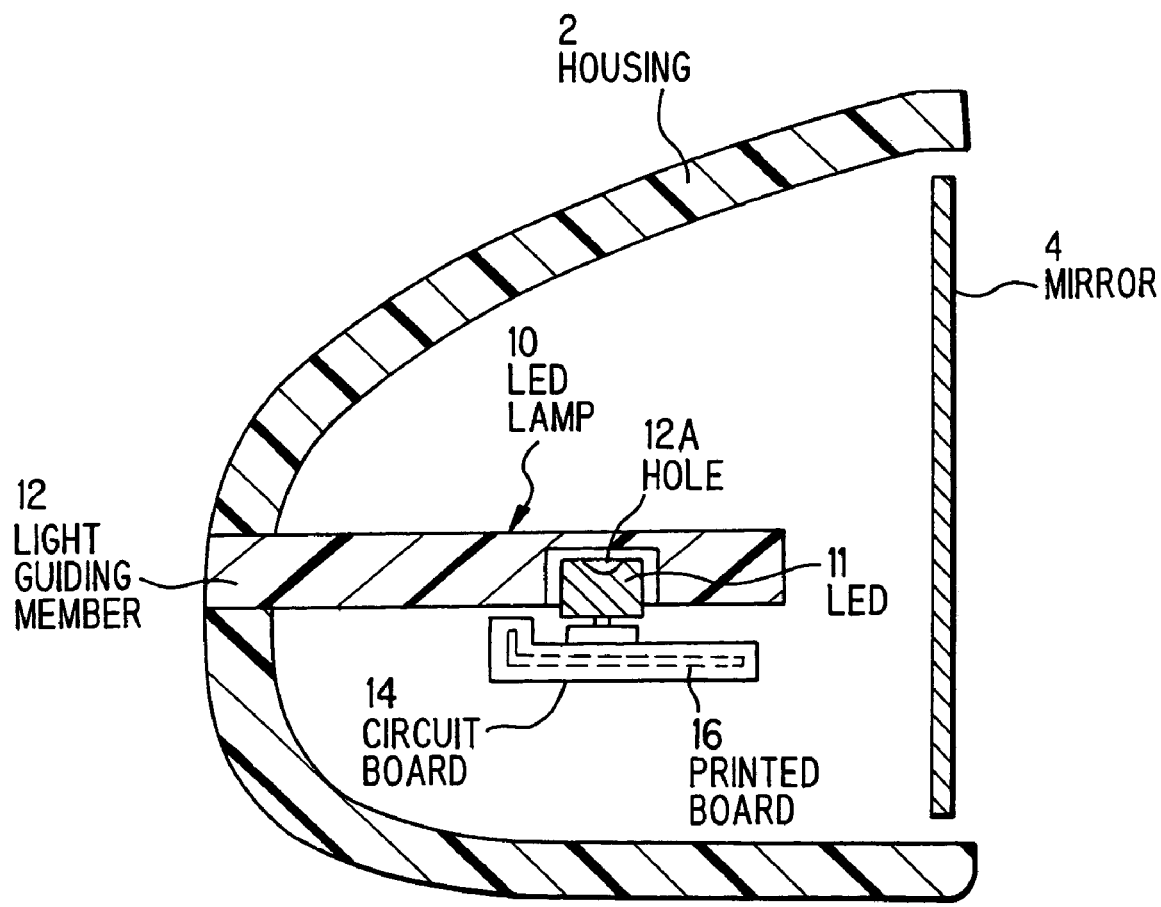
FIG. 5 is a cross sectional view cut along the line C-C in FIG. 3.

FIG. 5 is a cross sectional view cut along the line C-C in FIG. 3.

The LED 11 is electrically connected to a circuit board 14, which includes a printed board 16 having a wiring pattern to be connected with a light emitting element (described later) of LED 11, where electrical circuits of automobile 20 is connected through a harness (not shown) with the printed board 16. The circuit board 14 has such a water-proof structure (not shown) that it is not wetted by waterdrop penetrated through the light-guiding member 12.

Figure 6:
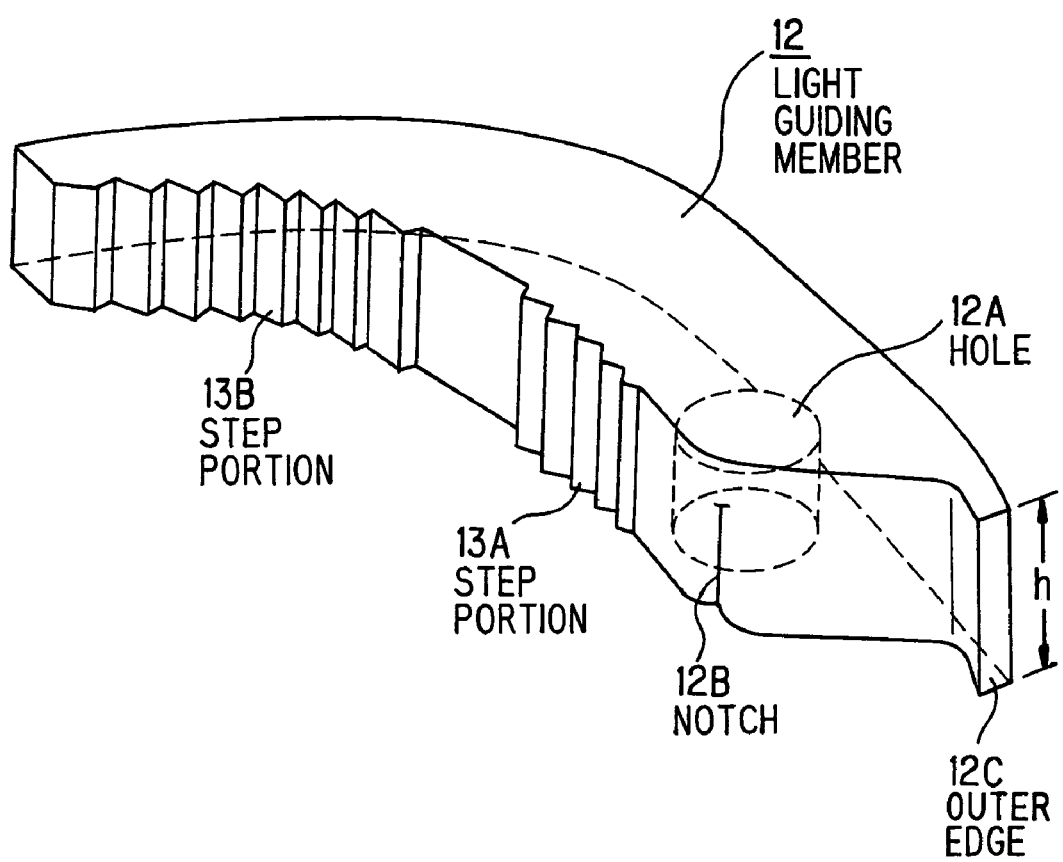
FIG. 6 is a perspective view showing a light guiding member 12 in FIG. 4.

FIG. 6 shows the profile of light-guiding member 12 in FIG. 4.

The light-guiding member 12 is formed by molding acrylic resin such that it has a curved face on the front and back sides to of offer a curved shape on the whole. Near the outer edge 12c of light-guiding member 12, there is provided a hole 12A to which the LED 11 is fitted in the vertical direction. The hole 12A does not penetrate as shown in FIG. 5, and the LED 11 is disposed such that the emission position of LED 11 is located at the middle of thickness h of light-guiding member 12. The outer edge 12C of light-guiding member 12 is extended being close to the end of mirror 4 (FIG. 4).

The front face of light-guiding member 12 is designed such that it has the same surface height as the housing 2. The light-guiding member 12 is provided with saw-tooth step portions 13A, 13B on the back so as to evenly and widely diffuse light from the LED 11. The back face of light-guiding member 12 including the step portions 13A, 13B is provided with reflection film formed by plating, silver (or aluminum, chrome) deposition, silver or white coating, or tape adhesion of aluminum etc. to enhance the reflection efficiency. Alternatively, by determining the position of LED 11 or by forming the back surface of light-guiding member 12 such that light heading to the back side thereof has an incident angle exceeding the critical angle, incident light is total-reflected on the back face. In this case, the reflection film is not necessary.

As shown in FIG. 6, a V-shaped notch 12B is provided on the back of hole 12A (near the mirror 4) such that it diffuses widely light radiated from LED 11 to the back side without reflecting light back to the direction of LED 11. Thereby, direct light from LED 11 is combined with reflected light from the back side such that unevenness in lighting can be prevented.

Figure 7:
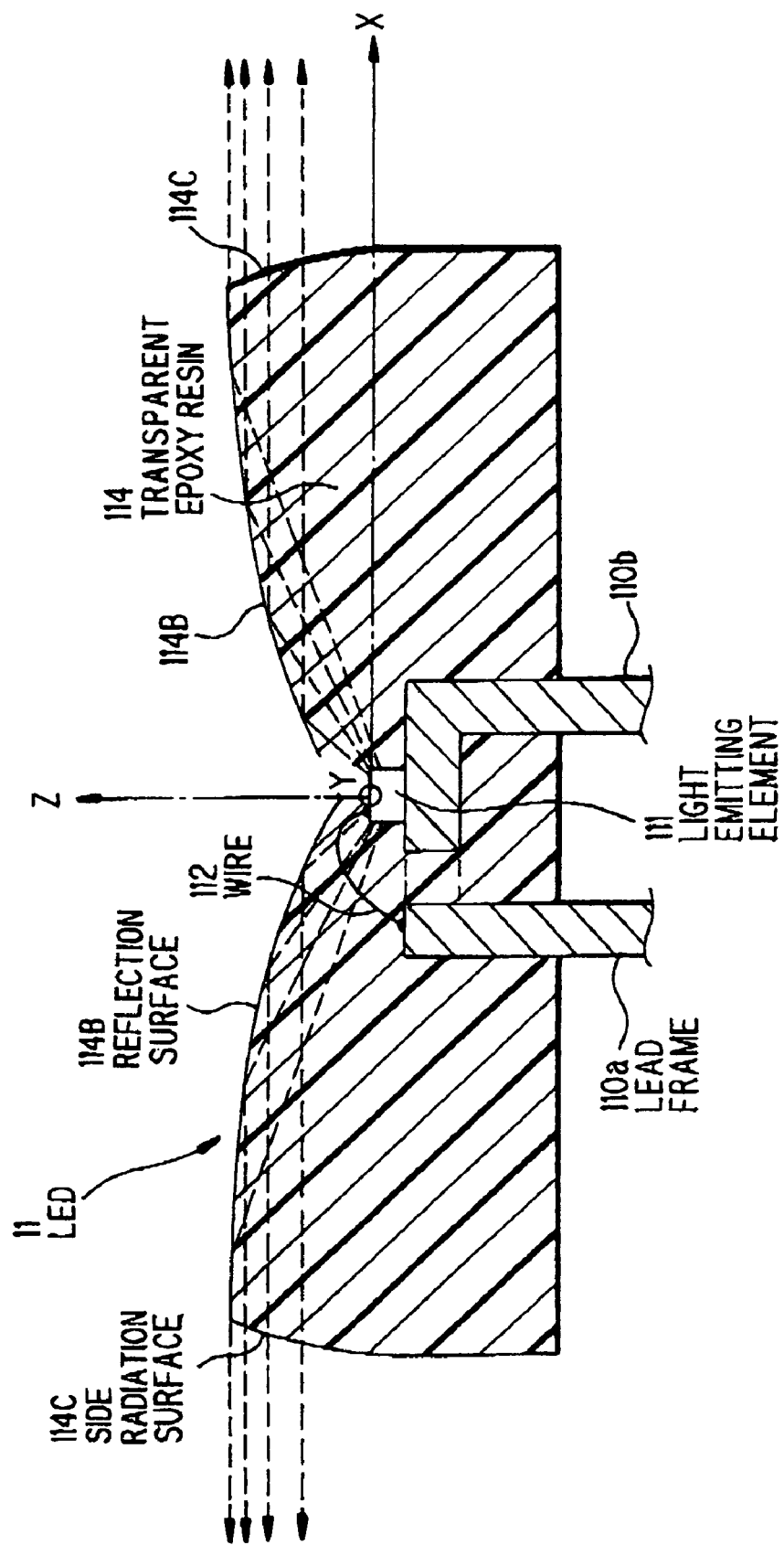
FIG. 7 is an enlarged cross sectional view showing LED 11 in FIG. 4.

FIG. 7 shows the details of LED 11 in FIG. 4.

The LED 11 is composed of; a pair of lead frames 110a, 110b that are disposed through a gap for insulation on X-Y plane; a light emitting element 111 that is mounted on the origin-point position of the lead frame 110b, which is formed by bending a strip plate into L-shape; a wire 112 to electrically connect the top-face electrode of light emitting element 111 to the top portion of lead frame 110a; and transparent epoxy resin 114 that is shaped like a flat column and seals the lead frames 110a, 110b, light emitting element 111 and wire 112.

The transparent epoxy resin 114 is composed of: a reflection surface 114B which is shaped like an arc and continuously extends from just over the light emitting element 111 to the side direction; and a side radiation surface 114C.

The reflection surface 114B is shaped like an umbrella by rotating part of a parabola, which has a focal point at the center of emission surface of light emitting element 111 and is symmetrical to X-axis, around Z-axis in a range of within 60 or more degrees from Z-axis.

With the LED 11 such composed, light radiated from the light emitting element 111 is reflected on the reflection surface 114B and, thereby, it can be effectively radiated in the lateral direction vertical to the central axis of light emitting element 111. By attaching the LED 11 to the light-guiding member 12, light radiated laterally from the light emitting element 111 is reflected by the back face of light-guiding member 12 including the step portions 13A, 13B. Thus, light of the LED 11 can be radiated in a wider range and therefore the visibility thereof can be enhanced.

It is desirable for people or a vehicle existing around the automobile that the LED lamp 10 turns on when the existence of rearview mirror apparatus 1 is needed to confirm, e.g., at night, rather than in normal driving. Thus, the interconnection of electrical circuit to the circuit board 14 is laid such that the LED lamp 10 turns on in conjunction with any one or all of blinker lamp (turn lamp), parking lamp etc. Further, the circuit may be composed such that a front position light is manually turned on by the driver. The color of light radiated from the LED lamp 10 is desirably amber series when the LED 10 is used for blinker lamp (turn lamp), parking lamp etc. and is desirably white series when used for front position light. A desired light color may be obtained by combining the emission color of LED 11 and the color of light-guiding member 12. For example, amber series light can be obtained using any one of:

(1) combination of amber series emission light from LED 11 and transparent or semi-transparent and colorless light-guiding member 12;
(2) combination of white series emission light from LED 11 and transparent or semi-transparent and amber series color light-guiding member 12; and
(3) combination of amber series emission light from LED 11 and transparent or semi-transparent and amber series color light-guiding member 12.

By combining the plane radiation type LED 11 and the light-guiding member 12 with wide reflection surface, the range of light radiation can be significantly widened even when only one LED is used. Therefore, the number of LED's used can be reduced.

Figure 8:
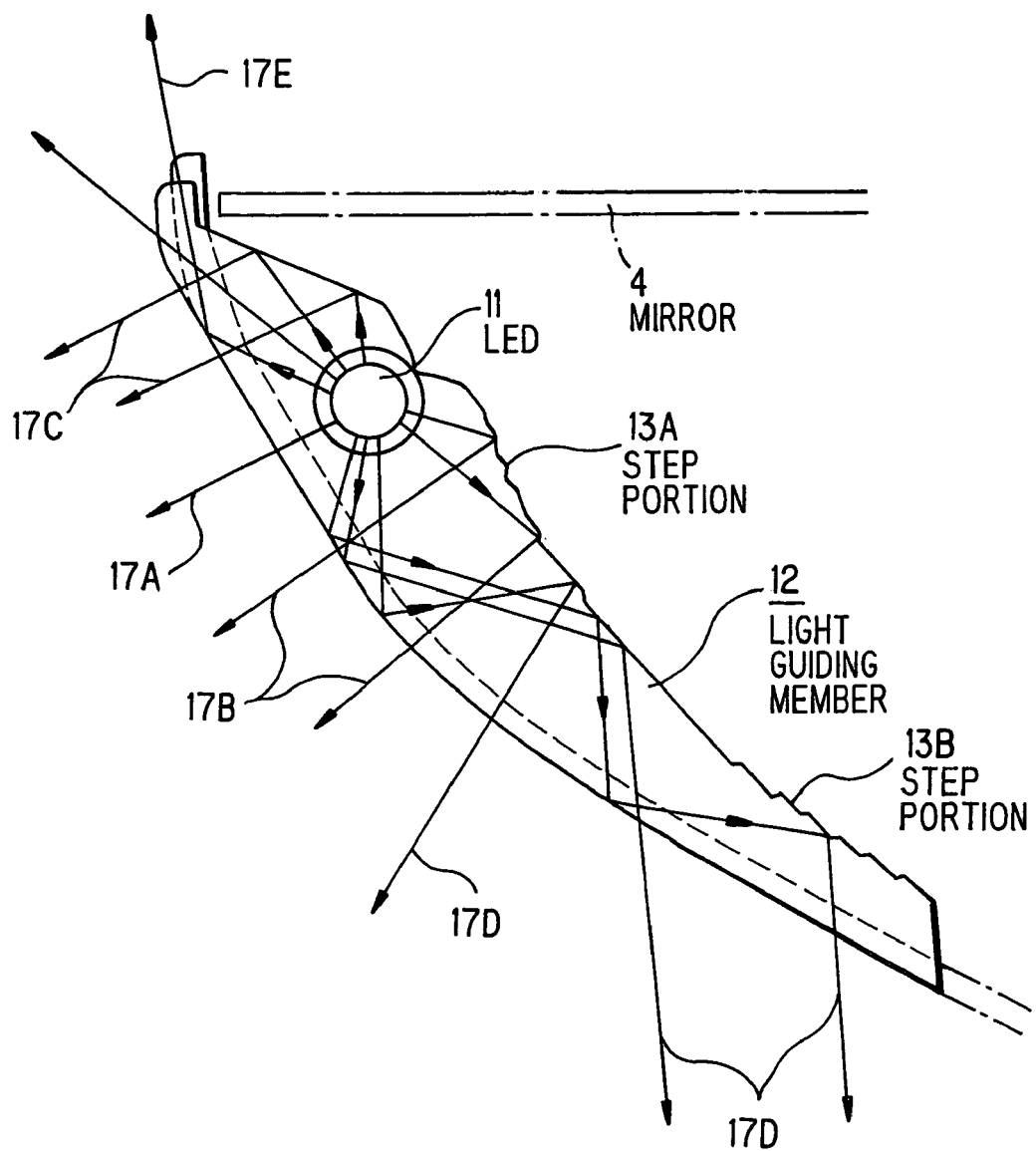
FIG. 8 is a cross sectional view illustrating light reflection paths in the light guiding member 12 when the LED 11 emits light.

FIG. 8 shows the reflection paths of light radiated from LED 11 in the light-guiding member 12.

In operation, when power is supplied to LED 11, LED 11 emits light. As shown in FIG. 8, light emitted from LED 11 is radiated to all directions (radius directions) of 360° on the horizontal plane. Part of light radiated is transmitted, through the light-guiding member 12, directly radiated forward and sideward as shown by an arrow 17A in FIG. 8. Another part of light heads to the back face with the step portions 13A, 13B and the other portion, and it is, being reflected on there, radiated forward as shown by arrows 17B, 17C in FIG. 8. A still another part of light is repeatedly reflected in the light-guiding member 12 as shown by an arrow 17D in FIG. 8, then radiated from the near-end to the diagonally-front of light-guiding member 12. Further, part of light is total-reflected on the front of light-guiding member 12 as shown by an arrow 17E in FIG. 8, then radiated backward.

In the first embodiment, the LED lamp 10 is composed of the plane radiation type LED 11 as light source, and the light-guiding member 12 that is formed laterally-extended and curved and is provided with the step portions 13A, 13B on the back. Light from the LED 11 is guided to the front face and back face of light-guiding member 12, light guided to the front face is directly radiated in the front and side directions of housing 2. Light not directly transmitted through the front face and light radiated to the back face are reflected on the step portions or back face, then radiated as controlled light out of the housing 2. Thus, light radiated from the LED 11 can be taken out in a desired direction from the entire face of light-guiding member 12. Therefore, light efficiently taken out from the plane radiation type LED 11 can be effectively distributed to a direction needed to increase light intensity. Hence, the power consumption can be reduced because the number of light source needed decreases.

Although in the first embodiment the LED 11 is disposed near the outer edge of light-guiding member 12, it may be disposed anywhere in the light-guiding member 12 if it is enabled to radiate light evenly to the step portions 13A, 13B. Although in the first embodiment only one LED is used, a plurality of LED's may be used and thereby the light intensity can be increased. In such a case, the LED's may be disposed on both sides, discretely at several positions or laying two LED's upward and downward at one site. Although in the first embodiment the LED 11 is inserted from the bottom of light-guiding member 12, it may be inserted from the top of light-guiding member 12.

Although in the first embodiment the back face of light-guiding member 12 is provided with the saw-tooth step portions 13A, 13B, it may be provided with another structure, such as pyramid unevenness, so as to evenly take out light from the light-guiding member 12.

Although in the first embodiment the light-guiding member 12 has the exposed front face while being fitted to the housing 2, the front face of light-guiding member 12 may be covered with the housing 2. In this case, part of housing 2 to cover the light-guiding member 12 may be transparent or semi-transparent and may be provided with a diffusion surface such as uneven face.

Although in the first embodiment the rearview mirror apparatus 1 is applied to four-wheel automobiles, it may be applied to a variety of vehicles such as motorcycles, side cars, special-purpose vehicles. In case of automobile, the rearview mirror apparatus 1 can be applied to a fender mirror other than the door mirror shown in FIG. 2. In this case, the same effect as the door mirror can be obtained.

The LED lamp 10 described above can be also applied to a lighting system such as a vehicle lighting equipment other than the rearview mirror apparatus. Other applications of LED lamp will be described below.

Second Embodiment

Figure 9:
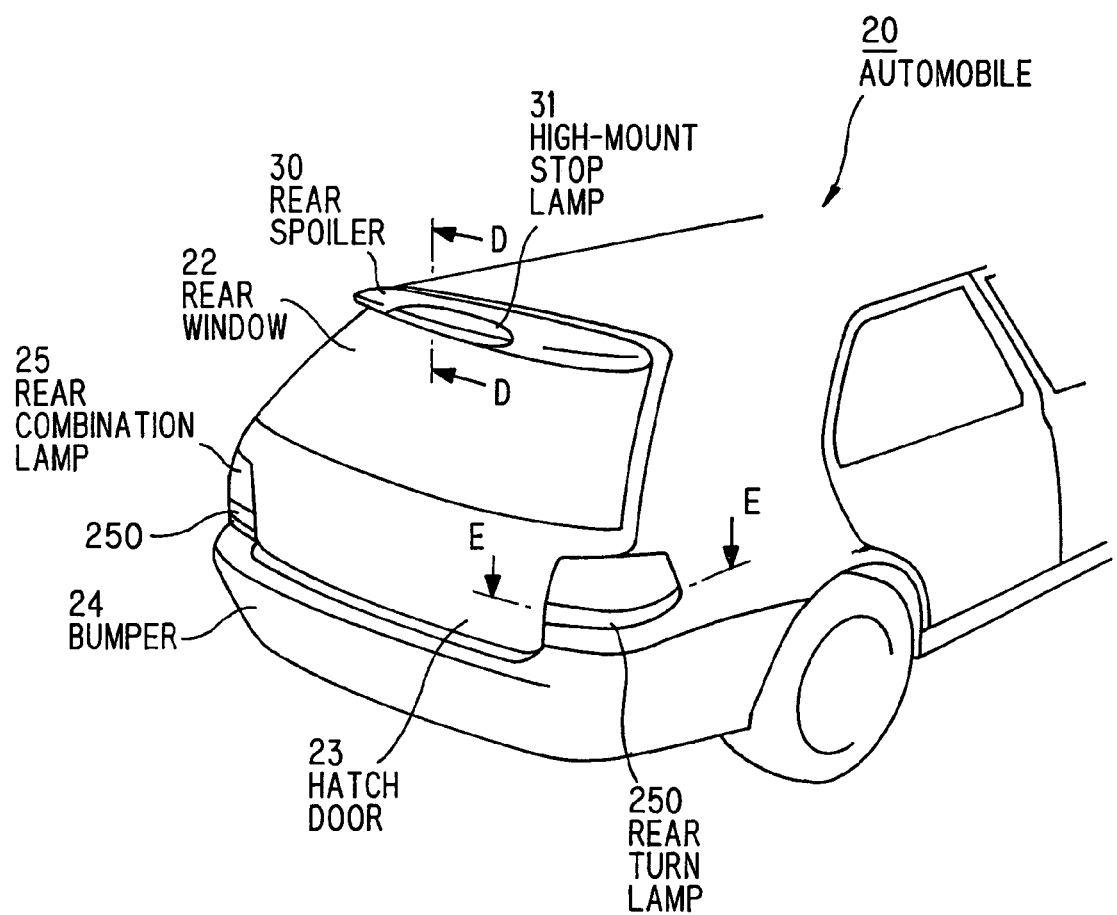
FIG. 9 is a perspective view showing the rear section of an automobile 20.

FIG. 9 is a perspective view showing the rear section of an automobile 20. The rear section of automobile 20 is composed of: a hatch door 23 that is enabled to open and shut with a rear window 22; a bumper 24 that is of resin mold and is enabled to protect the rear portion of automobile 20; a rear combination lamp 25 that is provided at the rear corner of automobile 20; rear turn lamp 250 that has LED as a light source and is built in the rear combination lamp 25; a rear spoiler 30 that is of resin and is provided on the upper side of rear window 22; and a high-mount stop lamp 31 that is incorporated in the rear spoiler 30 and is enabled to radiate red light.

Figure 10A:
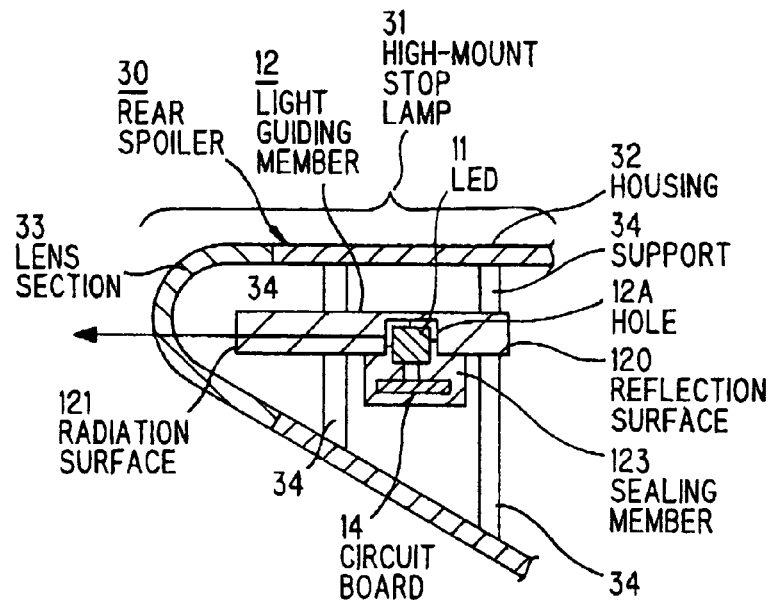
FIG. 10A is a cross sectional view cut along the line D-D in FIG. 9 to show a high-mount stop lamp 31 in a second preferred embodiment of the invention.

FIG. 10A is a cross sectional view cut along the line D-D in FIG. 9 to show the high-mount stop lamp 31 in the second preferred embodiment of the invention.

Figure 10B:
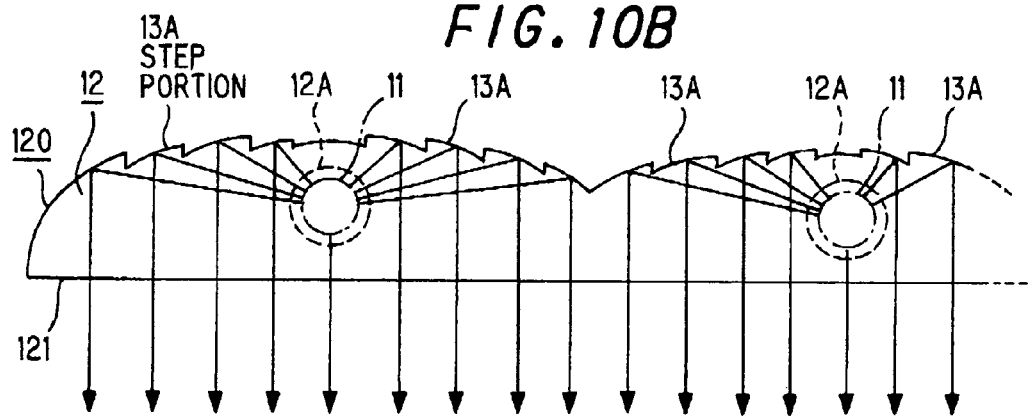
FIG. 10B is a top view showing a light-guiding member 12 of the high-mount stop lamp 31.

FIG. 10B is a top view showing a light-guiding member 12 of the high-mount stop lamp 31.

Figure 10C:
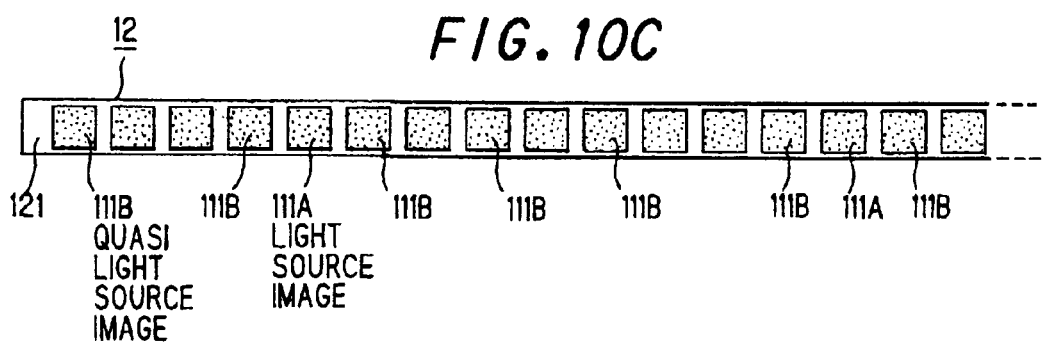
FIG. 10C is a partial front view showing a light radiation surface 121 of the light-guiding member 12.

FIG. 10C is a partial front view showing a light radiation surface 121 of the light-guiding member 12.

Meanwhile, in the description below, like components are indicated by the same numerals used in the first embodiment.

As shown in FIG. 10A, the high-mount stop lamp 31 is composed of: a housing 32 that is of opaque resin; a lens section 33 that is of red opaque resin and is shaped extending along the housing 32; and a support member 34 that supports the light-guiding member 12 to be at a predetermined position.

LED 11 is of plane radiation type and is enabled to emit red light. It is formed integrated with the light-guiding member 12 by a sealing member 123 of a resin material such as epoxy resin while being housed in a hole 12A of the light-guiding member 12.

The light-guiding member 12 is provided with a light reflection surface 120 that is provided with a light reflecting film such as aluminum film to be formed by deposition, and a light radiation surface 121 that is enabled to externally radiate light emitted form the LED 11.

FIG. 10B shows the light-guiding member 12 built in the high-mount stop lamp 31. The light-guiding member 12 is provided with a step portion 13A, formed on the light reflection surface 120, which is enabled to reflect light emitted from the LED 11 in a predetermined direction. The step portion 13A is provided according to the number of LED's housed in the light-guiding member 12.

FIG. 10C shows a light source image in the light radiation surface 121 of light-guiding member 12. When the LED 11 is turned on, light emitted from the LED 11 in the direction of light reflection surface 120 is reflected by the step portion 13A and is then externally radiated through the light radiation surface 121. Thus, on the light radiation surface 121, there are formed light source images 111A of LED 11 and quasi light source images 111B based on light reflected on the step portions 13A.

In the second embodiment, a plurality of quasi light source images can be formed by using a small number of light sources. Therefore, the high-mount stop lamp 31 can have a novel visibility based on such a good light distribution characteristic over a wider range while offering a low-profile body, lower power consumption and longer operating life.

Meanwhile, since the second embodiment uses the LED 11 to emit red light, the lens section 33 may be of transparent resin.

Third Embodiment

FIG. 11 is a cross sectional view cut along the line E-E in FIG. 9 to show the rear turn lamp 250 in the third preferred embodiment of the invention.

The rear turn lamp 250 is composed of a light-guiding member 12 that houses three plane radiation type LED's 11A, 11B and 11C in holes 12A and that is disposed inside an outer lens 251 of acrylic resin. The LED's 11A, 11B and 11C emit amber series light. Step portions 13A, 13B and 13C formed on a light reflection surface 120 are optically designed such that light from the LED's 11A, 11B and 11C is radiated in such a direction as not to disturb the driver of oncoming car. The number of LED's is not limited to three and may be one.

In the third embodiment, adding to the effects of the second embodiment, the car interior space can be increased since the protrusion volume of rear turn lamp 250 into the car interior can be reduced. Further, since the surface area of rear turn lamp 250 can be reduced, a design freedom of car body can be increased. Still further, the rear turn lamp 250 can have a novel visibility by externally radiating a plurality of light source images through the light-guiding member 12. In addition, due to the plane radiation type LED's 11A, 11B and 11C, the brightness can be enhanced while offering a low-profile body.

Although in the third embodiment the rear turn lamp 250 with LED 11 to emit amber series light is exemplified, it can be applied to a stop lamp, tail lamp, rear lamp etc. to be incorporated in a rear combination lamp. In such a case, the emission color of LED 11 may be changed to another color such as red and white.

Fourth Embodiment

Figure 12A:
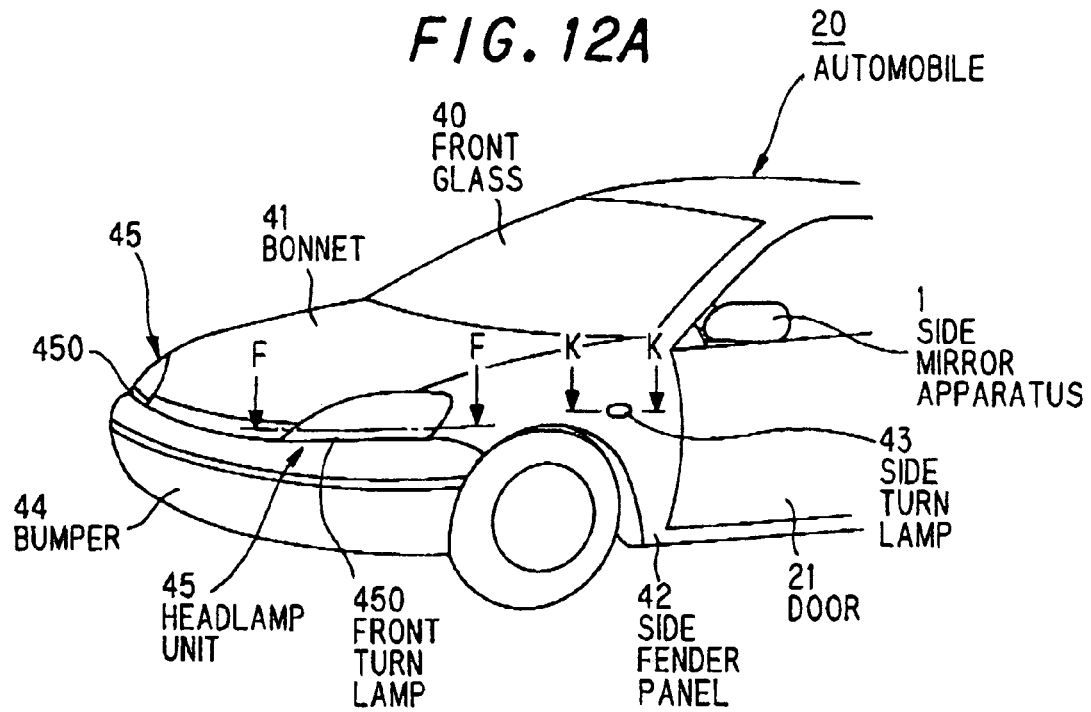
FIG. 12A is a perspective view showing the front section of an automobile 20.

FIG. 12A is a perspective view showing the front section of an automobile 20.

The automobile 20 is composed of: a front glass 40 that is disposed in front of a cabin space; an engine hood 41 that is disposed in front of the front glass 40; a side fender panel 42 that covers the front side section of car body while extending along the engine hood 41; a side turn lamp 43 that is disposed in the side fender panel 42; a bumper 44 that is of resin mold and is enabled to protect the front portion of automobile 20; a head lamp unit 45 that is provided at the front corner of automobile 20; and a front turn lamp 450 that is incorporated in the head lamp unit 45.

Figure 12B:
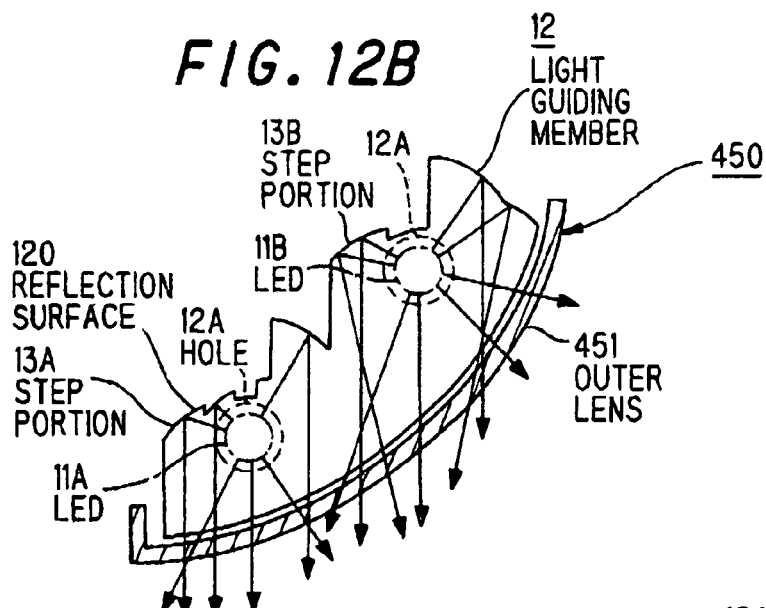
FIG. 12B is a cross sectional view cut along the line F-F in FIG. 12A to show a front turn lamp 450 in a fourth preferred embodiment of the invention.

FIG. 12B is a cross sectional view cut along the line F-F in FIG. 12A to show the front turn lamp 450 in the fourth preferred embodiment of the invention.

The front turn lamp 450 is provided with a light-guiding member 12 that is disposed inside an outer lens 451 and LED's 11A, 11B to emit amber series light. The LED's 11A, 11B are housed in holes 12A of the light-guiding member 12. Although in the fourth embodiment the two LED's 11A, 11B are used to be incorporated in the head lamp unit 45, the number of LED's is not specifically limited.

In the fourth embodiment, adding to the effects of the third embodiment, the front turn lamp 450 using LED can be incorporated in the head lamp unit 45 and the front turn lamp 450 can have a novel visibility while offering a downsized and low-profile body. Further, the front turn lamp 450 can be formed into an arbitrary shape according to the shape of head lamp unit 45. Although in the fourth embodiment the LED's 11A, 11B to emit amber series light are exemplified, the LED's 11A, 11B may have different emission light colors. For example, LED 11A to emit amber series light and LED 11B to emit white series light may be used.

Fifth Embodiment

Figure 12C:
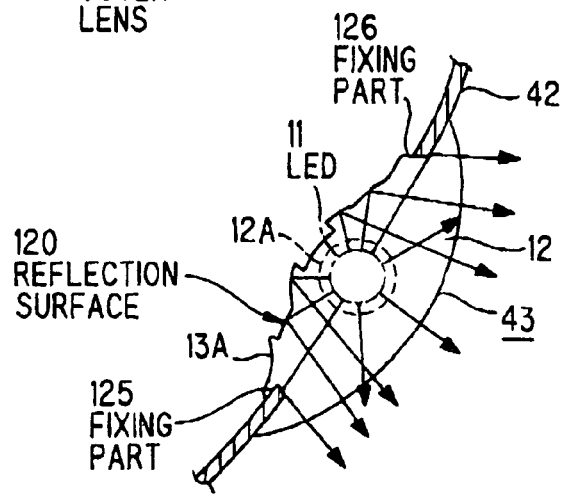
FIG. 12C is a cross sectional view cut along the line K-K in FIG. 12A to show a side turn lamp 43 in a fifth preferred embodiment of the invention.

FIG. 12C is a cross sectional view cut along the line K-K in FIG. 12A to show the side turn lamp 43 in the fifth preferred embodiment of the invention.

The side turn lamp 43 is provided with a light-guiding member 12 that also functions as an outer lens, a plane radiation type LED 11 that is enabled to emit amber series light, and fixing parts 125, 126 that are formed as part of the light reflection surface 120. The light-guiding member 12 is fixed by the engagement between the fixing parts 125, 126 and the side fender panel 42.

In the fifth embodiment, adding to the effects of the fourth embodiment, the number of parts can be reduced since the outer lens is not needed. Therefore, the manufacturing cost can be reduced.

Sixth Embodiment

Figure 13A:
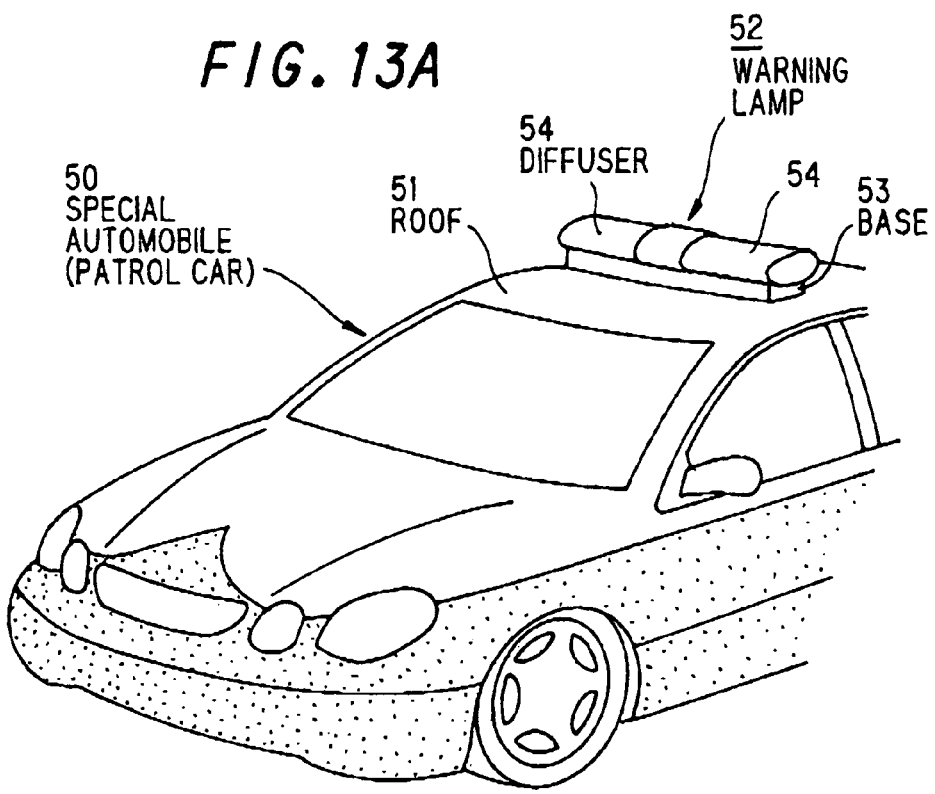
FIG. 13A is a perspective view showing the front section of a special automobile 50.

FIG. 13A is a perspective view showing the front section of a special automobile 50.

Figure 13B:
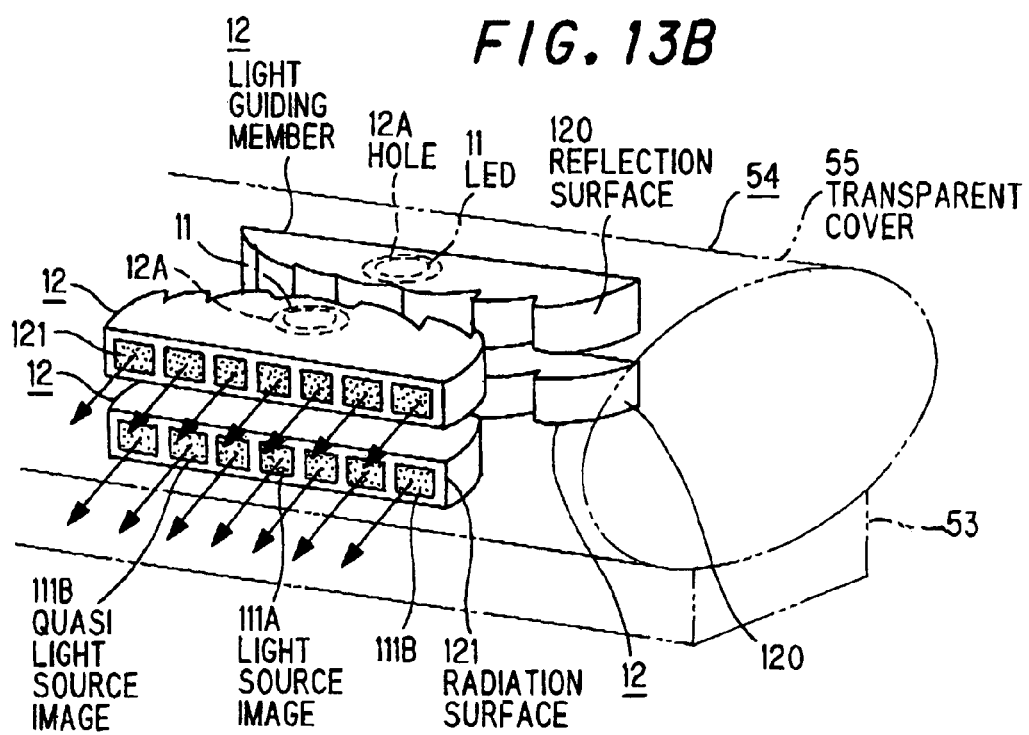
FIG. 13B is an enlarged perspective view showing part of a warning lamp 52 in FIG. 13A in a sixth preferred embodiment of the invention.

FIG. 13B is an enlarged perspective view showing part of a warning lamp 52 in FIG. 13A in the sixth preferred embodiment of the invention.

The special automobile 50 is a patrol car, and it is provided with the warning lamp 52 that is mounted on a roof 51 of the special automobile 50 and is enabled to radiate red light.

The warning lamp 52 is provided with a base 53 that serves as a fixing member to the roof 51, and a diffuser 54 that houses a light source to generate red light.

The diffuser 54 is, as shown in FIG. 13B, composed of: a transparent cover 55 of red transparent resin; a plurality of light-guiding member 12 that is housed in the transparent cover 55; and a plane radiation type LED 11 that is housed in a hole 12A of the light-guiding member 12 and is enabled to emit red light. The light-guiding members 12 are housed in the transparent cover 55 while being stacked in the vertical direction and having its light reflection surface 120 disposed opposed to each other.

In the warning lamp 52, light emitted from LED 11 being turned on is reflected on the light reflection surface 120 and then externally radiated from the light radiation surface 121. The light radiation surface 121 allows light based on light source image 111A and light based on quasi light source image 111B to be radiated therefrom.

In the sixth embodiment, since the warning lamp 52 is composed of the plurality of combinations of LED 11 and light-guiding member 12, the warning lamp 52 with a high visibility can be obtained even when using a small number of light sources.

Although in the sixth embodiment the warning lamp 52 mounted on the patrol car to radiate red light is exemplified, it can be applied to another special automobile having a warning lamp to radiate, e.g., yellow light.

Seventh Embodiment

Figure 14:
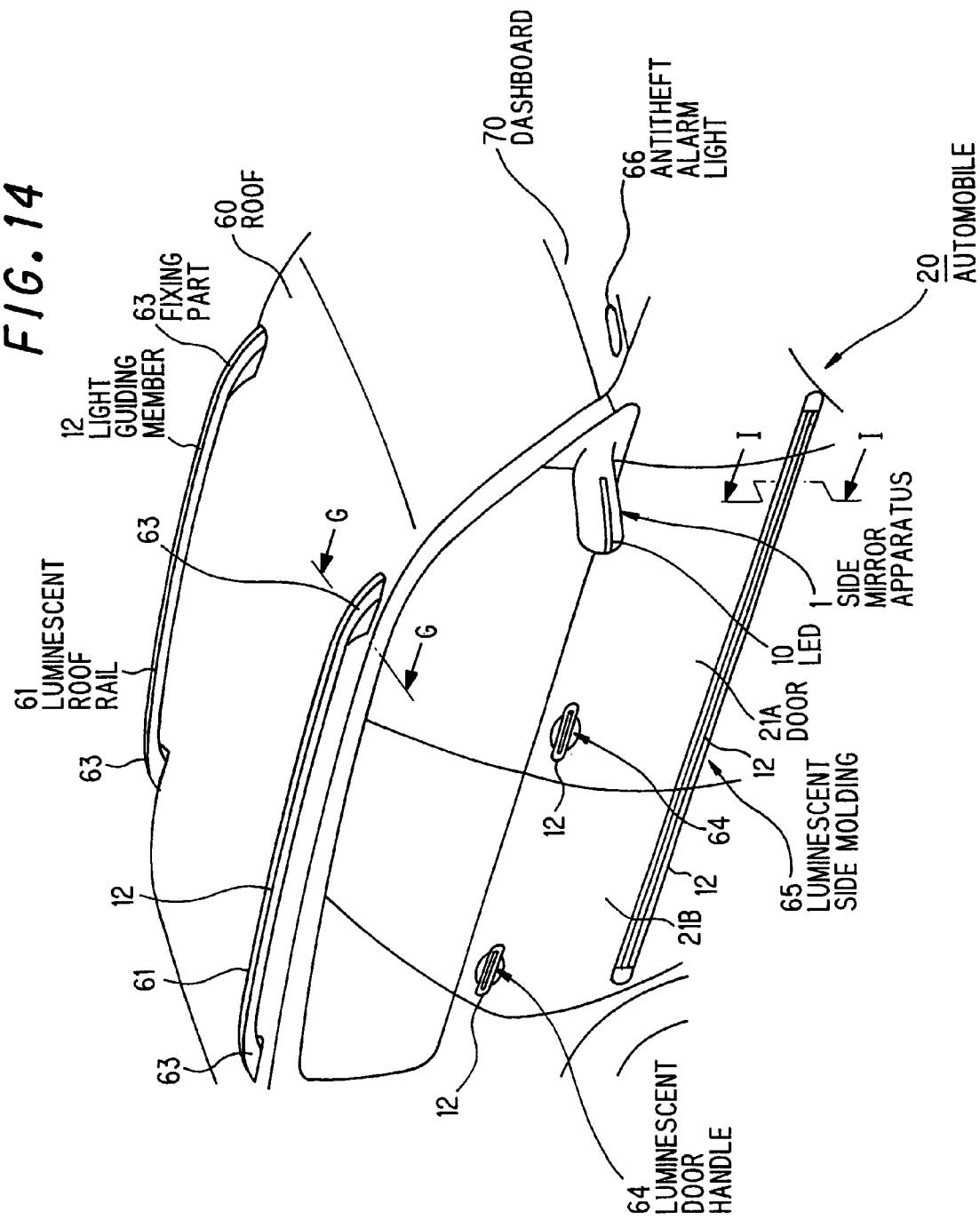
FIG. 14 is a perspective view showing the middle section of an automobile 20.

FIG. 14 is a perspective view showing the middle section of an automobile 20. The automobile 20 is composed of: a luminescent roof rail 61 mounted on a roof 60; a light-guiding member 12 that is incorporated in the luminescent roof rail 61; a roof rail fixing part 63 that fixe he luminescent roof rail 61 to the roof 60; a luminescent door handle 64 that is attached to a door 21A, 21B; a luminescent side molding 65 that is enabled to protect the door 21A, 21B; a light-guiding member 12 that is incorporated in the luminescent side molding 65; and a antitheft alarm light 66 that is incorporated in a dashboard.

FIG. 15A is a cross sectional view cut along the line G-G in FIG. 14 to show the roof rail in the seventh preferred embodiment of the invention.

The roof rail fixing part 63 is of resin with a high mechanical strength such as ABS (acrylonitrile butadiene styrene) and is integrated with the light-guiding member 12. A plane radiation type LED 11 to emit amber series light is housed in a hole 12A of the light-guiding member 12. A circuit board 14 is electrically connected to the LED 11 and is housed in the roof rail fixing part 63.

Amber light emitted from the LED 11 is radiated from a light radiation surface 121 of the light-guiding member 12. Also, light reflected on the light reflection surface 120 is radiated from the light radiation surface 120. Further, part of light emitted from the LED 11 is propagated while being repeatedly interface-reflected on the light reflection surface 120 and light radiation surface 121 of light-guiding member 12. Thereby, the entire light-guiding member 12 is enabled to generate amber light.

In the seventh embodiment, since the light-guiding member 12 of luminescent roof rail 61 is enabled to radiate light by using the LED 11 housed in the roof rail fixing part 63, the load applied to the battery of automobile 20 can be reduced. Therefore, the commodity value of roof rail as a luminescent accessory can be enhanced.

Eighth Embodiment

FIG. 15B is a front view showing the luminescent door handle 64 in the eighth preferred embodiment of the invention.

FIG. 15C is a cross sectional view cut along the line H-H in FIG. 15B.

The luminescent door handle 64 is composed of: a door handle 640 of resin such as ABS; and door handle fixing members 641, 642 that fix the door handle 640 so as to position it in a recess 210 of the door 21A, 21B. The door handle fixing member 641 is provided with a key insertion slot 643 used to lock or unlock the door. FIG. 15B shows a state that light source images 111A and quasi light source images 111B are formed on the light radiation surface 121 based on white light being emitted from the plane radiation type LED 11 built in the door handle 640.

The door handle 640 radiates white light from the light radiation surface 121, based on the emission of LED 11 provided at its center as shown in FIG. 15C. Also, white light emitted from the LED 11 to the door side is radiated form the light radiation surface 121 while being reflected on the light reflection surface 120.

The LED 11 is enabled to emit light, e.g., when turning on a lighting system such as head light, when operating a keyless entry device, and when inserting a key into the key insertion slot 643 and operating it.

In the eighth embodiment, since the light-guiding member 12 integrated with the door handle 640 is enabled to generate light based on the emission of the plane radiation type LED 11, the position of door handle 640 can be easily found even when the visibility is very low at night. Thus, the easiness in operating the door can be enhanced.

Further, since the light-guiding member 12 is enabled to generate light in the longitudinal direction of door handle 640 by providing the door handle 640 with the one plane radiation type LED 11, the door handle 640 can generate light without complicating its composition. Although in the eighth embodiment the plane radiation type LED 11 to emit white light is used, another LED may be used chat emits the other color light, e.g., amber light.

Ninth Embodiment

FIG. 15D is a cross sectional view cur along the line I-I in FIG. 14 to show the luminescent side molding 65 in the ninth preferred embodiment of the invention.

The luminescent side molding 65 is composed of: a molding body 65A of resin; a light-guiding member 12 that is disposed at the center of the molding body 65A; a plane radiation type LED 11 that is housed in a hole 12A of the light-guiding member 12 and is enabled to emit amber light; and a sealing member 620 of epoxy resin that integrally seals the LED 11, light-guiding member 12 and circuit board 14. The LED 11 and circuit board 14 are disposed inside the door 21A.

The luminescent side molding 65 allows amber light emitted from the LED 11 to be externally radiated from the light radiation surface 121. Also, amber light emitted from the LED 11 to the door side can be externally radiated from the light radiation surface 121 while being reflected on the light reflection surface 120. It is desired that the amount of light radiated from the light radiation surface 121 is so low as not to disturb the driver of oncoming car.

The LED 11 is enabled to emit light, e.g., when turning on a lighting system such as head light, when operating a keyless entry device, and when inserting a key into the key insertion slot 643 and operating it.

In the ninth embodiment, the side molding for protecting the door 21A from the contact with other structure is integrated with the luminescent indicator composed of the LED 11 and light-guiding member 12. Thereby, the light decoration characteristic on the side face of car body can be enhanced. Further, since the side molding can generate light, the driver can easily confirm his car's side edge by that lighting. Therefore, it can facilitate backing the car into the garage or parallel parking on the street.

Tenth Embodiment

Figure 16:
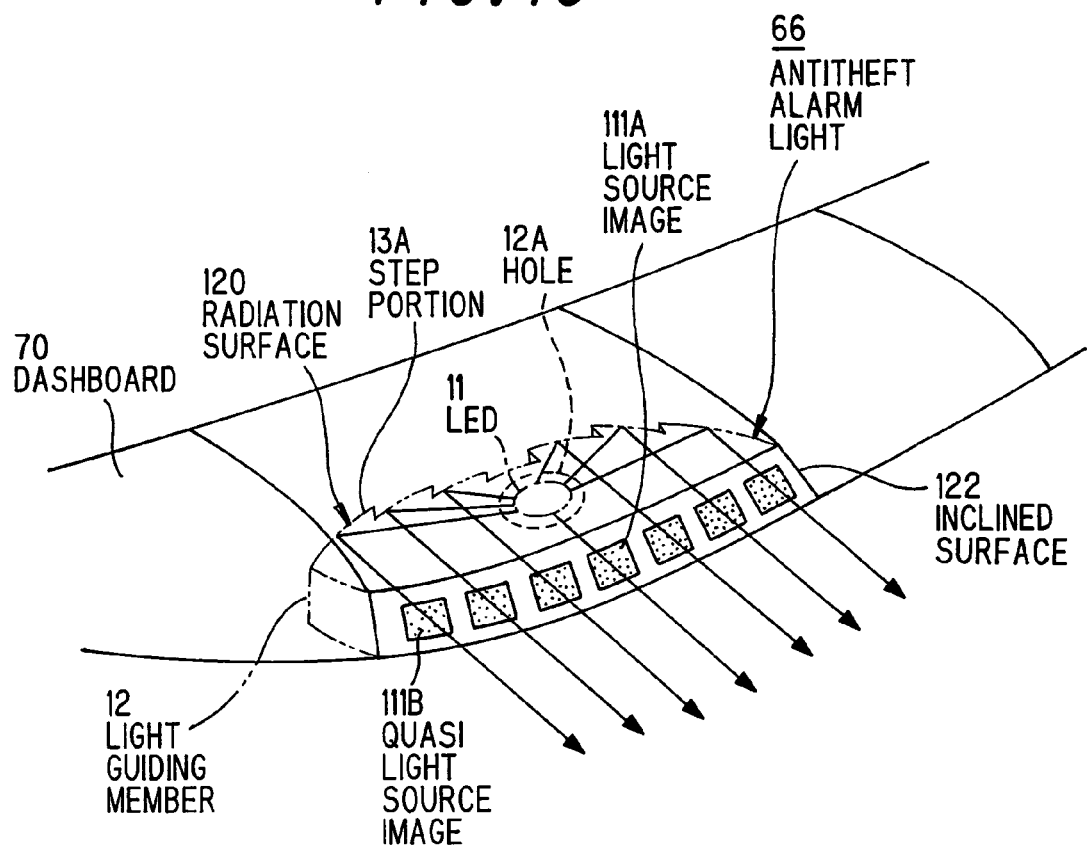
FIG. 16 is a perspective view showing an antitheft alarm light 66 in a tenth preferred embodiment of the invention.

FIG. 16 is a perspective view showing the antitheft alarm light 66 in the tenth preferred embodiment of the invention. The antitheft alarm light 66 uses the light-guiding member 12 and the plane radiation type LED 11 to emit red light described in the sixth embodiment. It has an inclined surface 122 from which light of LED 11 is taken out and which is formed integrated with the surface of the dashboard 70.

The LED 11 is enabled to emit light, e.g., when turning on a lighting system such as head light, when operating a keyless entry device, and when inserting a key into the key insertion slot 643 and operating it.

The antitheft alarm light 66 allows red light emitted from the LED 11 to be externally radiated from the light radiation surface 121. Also, red light emitted from the LED 11 to the back side of dashboard 70 can be externally radiated from the inclined surface 122 while being reflected on the light reflection surface 120. In operation of antitheft alarm light 66, the LED 11 is intermittently turned on. Thereby, light source images 111A and quasi light source images 111B are formed on the inclined surface.

In the tenth embodiment, the antitheft alarm light 66 is composed of the light-guiding member 12 and the plane radiation type LED 11. Thereby, it can be low-profiled and housed in a space on the front end of dashboard 70. Further, since the inclined surface 122 where to take out red light from the LED 11 is formed integrated with the surface shape of dashboard 70, the antitheft alarm light 66 can have an excellent appearance.

Eleventh Embodiment

Figure 17A:
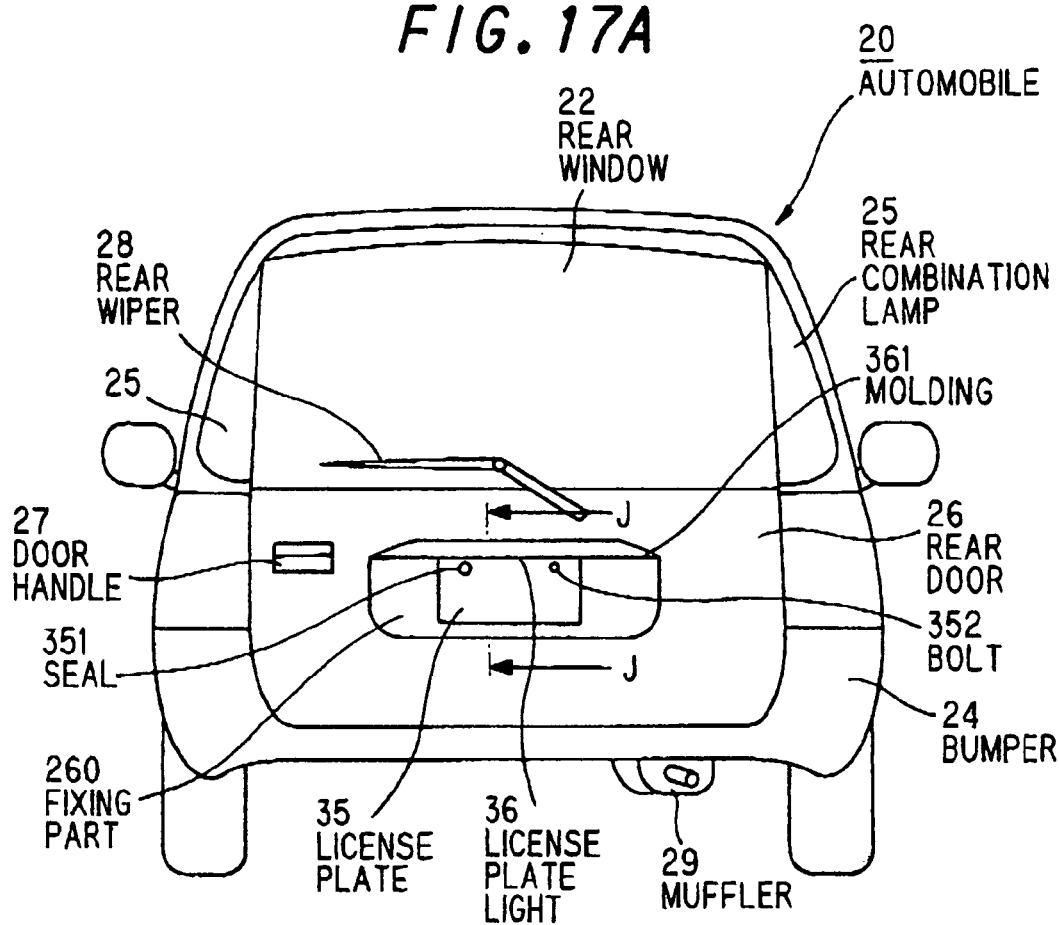
FIG. 17A is a front view showing the rear end of an automobile 20.

FIG. 17A is a front view showing the rear end of an automobile 20.

Figure 17B:
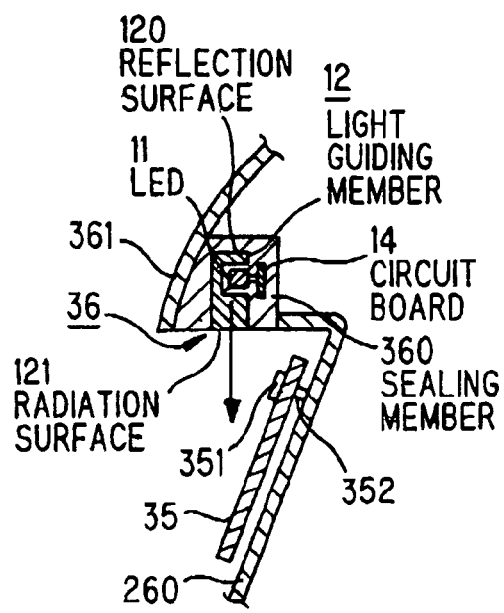
FIG. 17B is a cross sectional view cut along the line J-J in FIG. 17A to show a license plate light 36 in a eleventh preferred embodiment of the invention.

FIG. 17B is a cross sectional view cut along the line J-J in FIG. 17A to show a license plate light 36 in the eleventh preperred embodiment of the invention.

The automobile 20 is composed of: a rear window 22 that is provided on the rear side of the car body; a rear combination lamp 25 that is disposed on the side of the rear window 22; a rear wiper 28 that is enabled to remove rain drops on the rear window 22; a rear door 26 that is allowed to open and shut with the rear window 22 and rear wiper 28; a door handle 27 that is provided to operate the rear door 26; a bumper 24 that is of resin mold and is enabled to protect the rear portion of automobile 20; and a muffler 29 that is provided under the car body to muffle the exhaust sound.

The rear door 26 is composed of: a license plate fixing part 260 that fixes a license plate 35; a molding 361 that is provided above the license plate fixing part 260; a license plate light 36 that is disposed inside the molding 361 to light the license plate 35; a bolt 352 that fixes the license plate 35; and a seal 351 that seals the bolt 352.

The license plate light 36 is, as shown in FIG. 17B, composed of: a plane radiation type LED 11 that is enabled to emit white light; a light-guiding member 12 that is provided with a hole 12A to house the LED 11; and a sealing member 360 of epoxy resin that integrally seals the LED 11, light-guiding member 12 and circuit board 14.

The license plate light 36 allows white light emitted from the LED 11 to be externally radiated from the light radiation surface 121. Also, white light emitted from the LED 11 to the opposite side to the license plate can be externally radiated from the light radiation surface 121 while being reflected on the light reflection surface 120.

In the eleventh embodiment, the license plate light 36 is composed of the light-guiding member 12 and the plane radiation type LED 11. Thereby, it can offer a good visibility of the license plate 35 while being down-sized. The LED 11 incorporated in the light-guiding member 12 may be provided one or more.

Twelfth Embodiment

FIG. 18 is a perspective view showing a sign 80 in the twelfth preferred embodiment of the invention. The sign 80 is composed of a sign housing 80A of transparent resin, and a signboard 81 such as route guidance that is provided on the front side of the sign housing 80A.

The sign housing 80A houses a plane radiation type LED 11 that emits amber light, and a light-guiding member 12 that is disposed along the inner wall of the sign housing 80A and is provided with a hole 12A to house the LED 11. It is enabled to light the circumference of signboard 81 by amber light to be emitted from the LED 11 and radiated from the light radiation surface 121.

In the twelfth embodiment, since light emitted from the plane radiation type LED 11 is radiated being guided along the edge of sign housing 80A, a plurality of quasi light source images can be formed on the light radiation surface 121 while reducing the number of light sources. Thereby, the visibility of sign 81 can be enhanced. The color of light emitted from the LED 11 is not limited to amber, and may be white etc. Alternatively, a plurality of LED's with different emission colors may be used to light the edge of sign housing 80A.

This embodiment can be applied to other than the sign housing 80A. For example, a housing of audio equipment or a housing of desktop type personal computer can be provided with transparent lighting by using a luminescent indicator composed of LED 11 and light-guiding member 12. The embodiment can be also applied to a non-box type housing such as keyboard, mouse device and printer.

Thirteenth Embodiment

Figure 19:
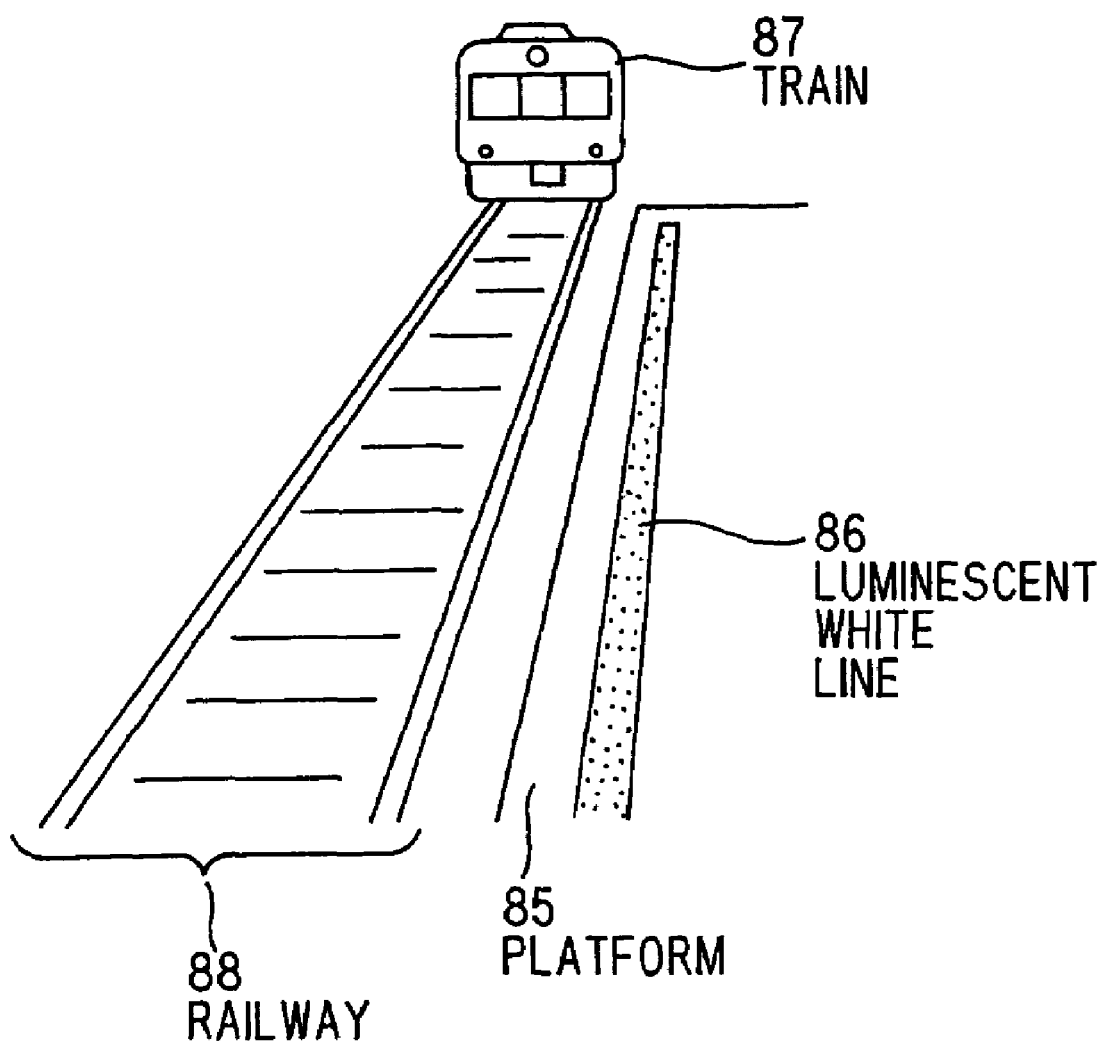
FIG. 19 is a perspective view showing a luminescent white line 86 in a thirteenth preferred embodiment of the invention.

FIG. 19 is a perspective view showing a luminescent white line 86 in the thirteenth preferred embodiment of the invention.

The luminescent white line 86 composed of LED 11 and light-guiding member 12 is provided on a platform 85 neighboring a railway 88. A plurality of the LED 11 and light-guiding member 12, which are the same as explained in the eleventh embodiment, are embedded in the platform 85. The luminescent white line 86 notifies the passengers of the oncoming of train 87 while generating light.

In the thirteenth embodiment, since light emitted from the plane radiation type LED 11 is radiated linearly being guided by the light-guiding member 12, the passengers on the platform 85 can be notified of oncoming train. Further, because of using the LED 11 as light source, a stable lighting can be secured for long hours as well as offering a longer operating life. The color of light emitted from the LED 11 is not limited to white, and may be amber etc.

Fourteenth Embodiment

Figure 20:
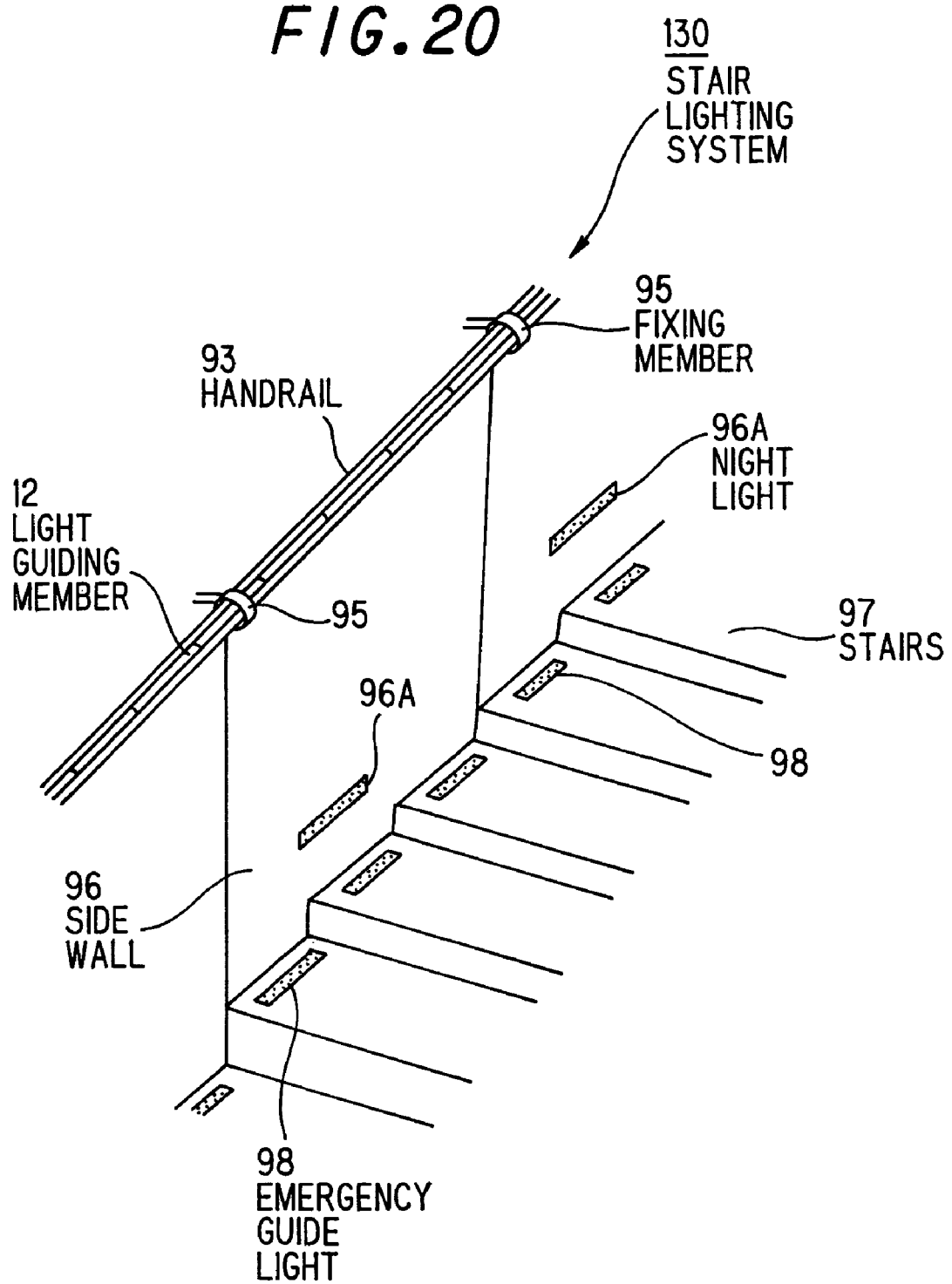
FIG. 20 is a perspective view showing a stair lighting system 130 in a fourteenth preferred embodiment of the invention.

FIG. 20 is a perspective view showing a stair lighting system 130 in the fourteenth preferred embodiment of the invention.

The stair lighting system including a luminous member composed of a plane radiation type LED and a light-guiding member 12 is applied to a station facility. It is composed of: a handrail 93 of metal; the light-guiding member 12 that is of transparent resin such as acrylic resin and is formed integrated with the handrail 93; a fixing member 95 that fixes the handrail 93 to a side wall 96; a night light 96A that is embedded in the side wall 96 while having a plane radiation type LED as light source; and stairs 97 that is provided with a guide light 98, which has a plane radiation type LED as light source, embedded therein.

The handrail 93 houses the plane radiation type LED (not shown) as light source, and allows light emitted the plane radiation type LED to be externally radiated from the surface of light-guiding member 12. The light-guiding member 12 is disposed linearly in the longitudinal direction of handrail 93.

The night light 96A, like the handrail 93, allows light emitted the plane radiation type LED (not shown) to be externally radiated from the surface of light-guiding member 12. Exposed part to the side wall 96 is the light radiation surface of light-guiding member 12.

The guide light 98, like the handrail 93 and night light 96A, allows light emitted the plane radiation type LED (not shown) to be externally radiated from the surface of light-guiding member 12. Exposed part to the surface of stair 97 is the light radiation surface of light-guiding member 12.

In the fourteenth embodiment, since the facility structure such as handrail, stairs and wall is provided with the luminescent indicator composed of plane radiation type LED and light-guiding member, the stair light system can offer a good visibility as well as reduced power consumption, without being limited by the shape of fitted structure. The color of light emitted from the LED 11 in the stair lighting system may be white, amber, blue etc. The fourteenth embodiment can be applied to a stair light system to be installed in a residence.

Fifteenth Embodiment

Figure 21:
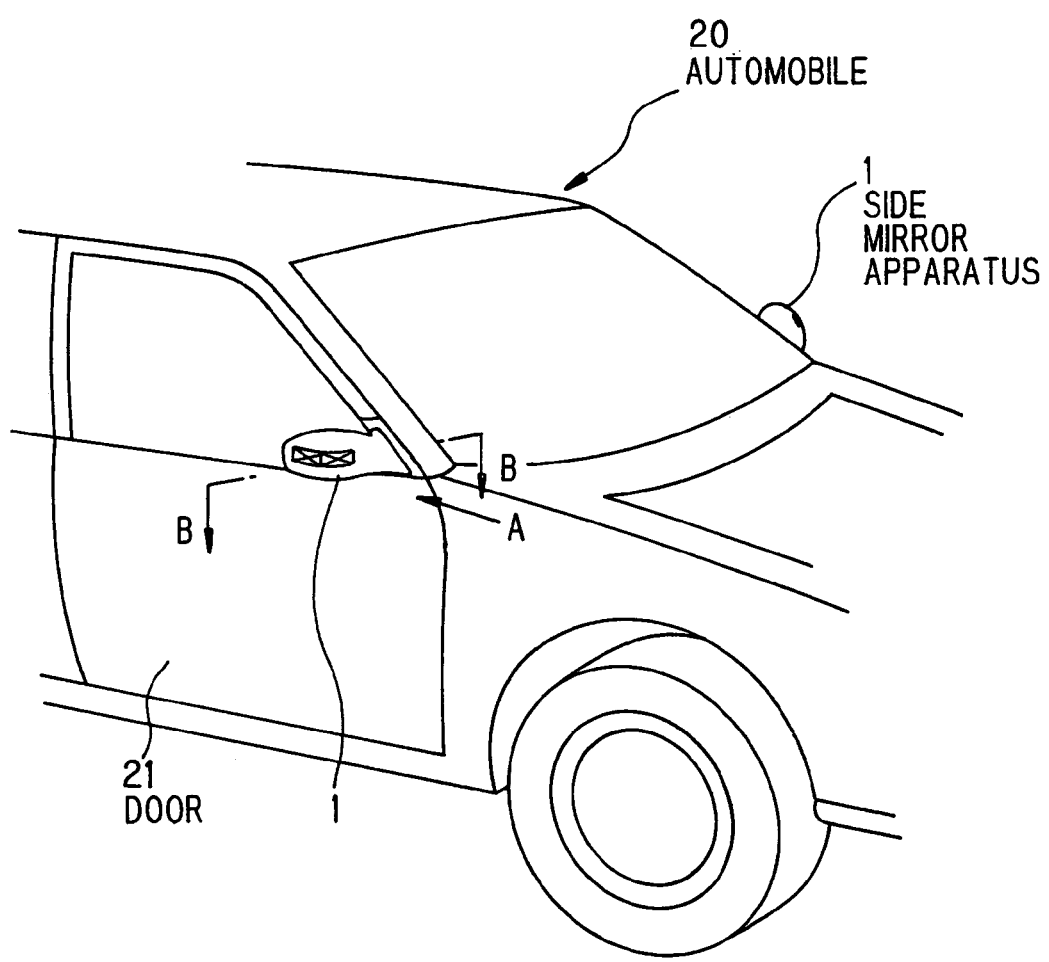
FIG. 21 is a perspective view showing part of automobile equipped with a rearview mirror apparatus in a fifteenth preferred embodiment of the invention.

FIG. 21 is a perspective view showing part of automobile equipped with a rearview mirror apparatus 1 in the fifteenth preferred embodiment of the invention.

The rearview mirror apparatus 1 is attached onto a front door 21 of automobile 30.

Figure 22:
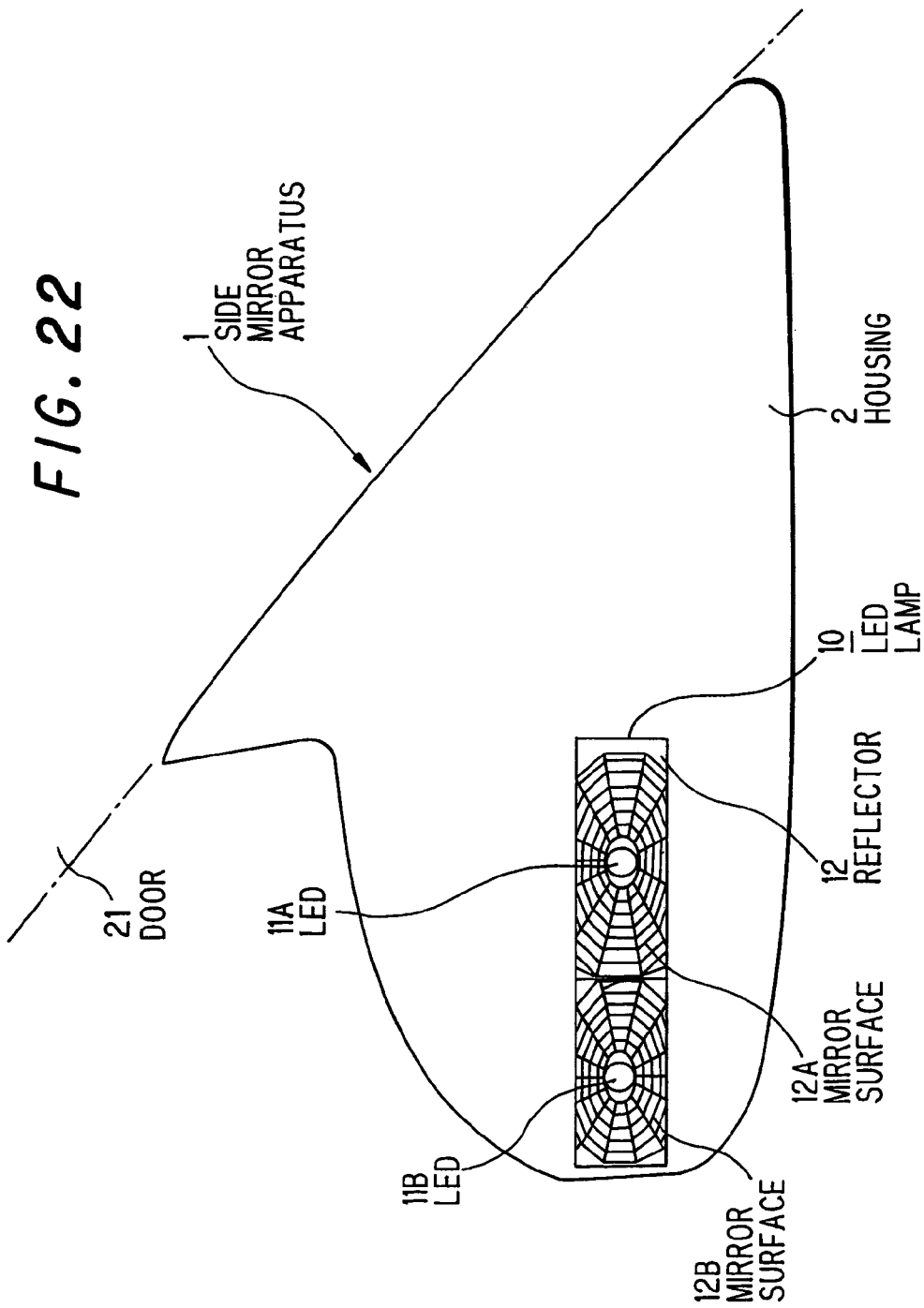
FIG. 22 is a front view showing the rearview mirror apparatus in the fifteenth embodiment.

FIG. 22 is a front view showing the rearview mirror apparatus 1 being viewed from a direction A in FIG. 21.

The rearview mirror apparatus 1 is composed of a housing 2 having a hollow structure made by resin molding, and an LED lamp 10 is disposed on the front-edge side thereof. The LED lamp 10 is designed such that it is integrated with the housing 2.

Figure 23:
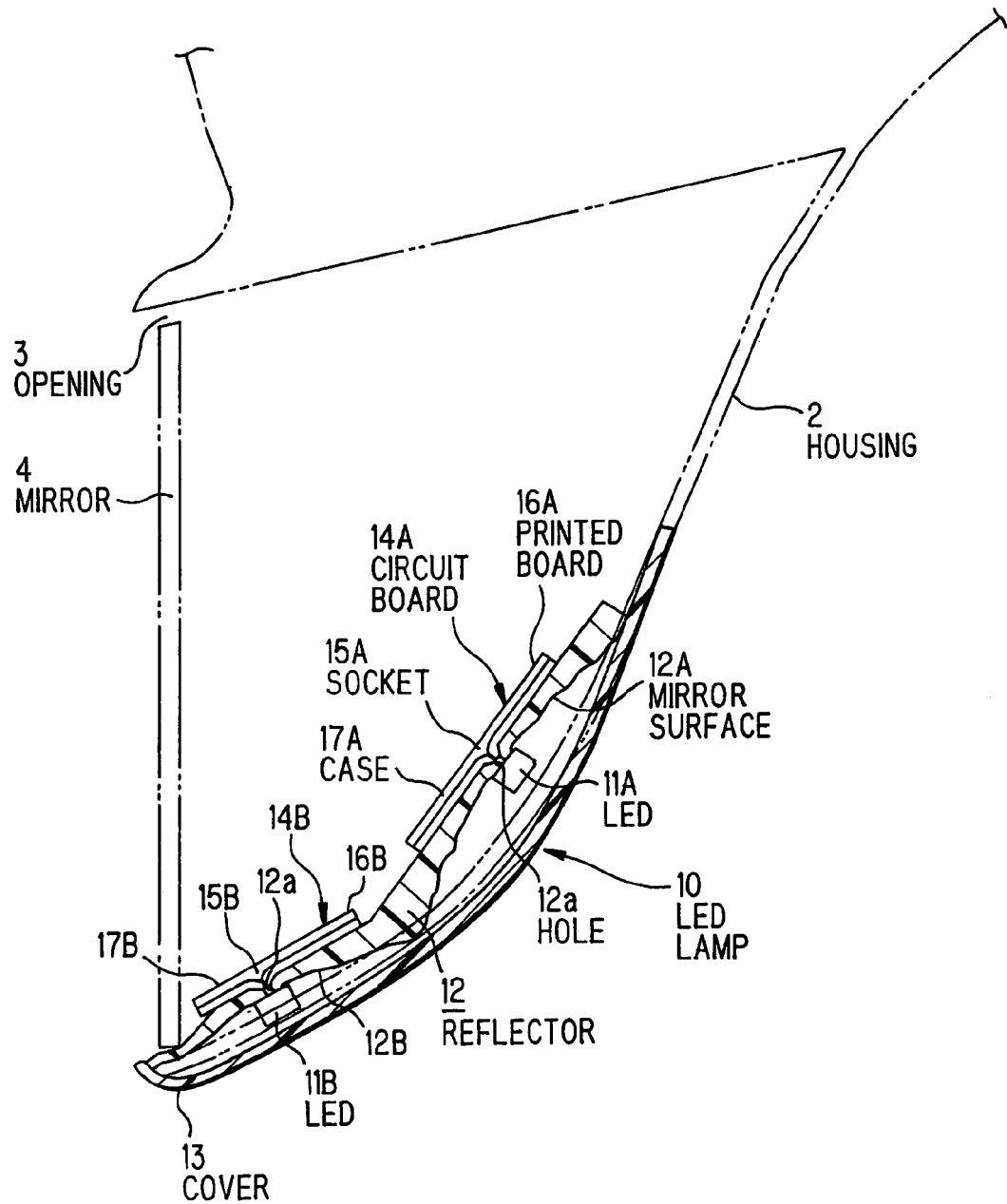
FIG. 23 is a cross sectional view cut along the line B-B in FIG. 21 to show LED lamp 10 in FIG. 22.

FIG. 23 is a cross sectional view cut along the line B-B in FIG. 21 to show LED lamp 10 in FIG. 22.

An opening 3 is formed on the back side of the housing 2 and a mirror 4 is disposed to close the opening 3. The mirror 4 is rotatably fixed to a support member (not shown), for example, a support member with a rotation mechanism as shown in FIG. 1 or a support member with a motor-driven mechanism to be operated by a remote controller provided in the automobile.

The LED lamp 10 is composed of: plane radiation type LED's 11A, 11B as a light source; a reflector 12 to reflect light radiated from LED's 11A, 11B; a transparent cover 13 that is of glass or resin and disposed to cover the reflector 12; circuit boards 14A, 14B that function as connection terminals to wire harness (not shown) while fixing LED's 11A, 11B; and sockets 15A, 15B into which a pair of lead terminals of LED's 11A, 11B are inserted.

It is desirable for people or vehicle around the automobile that the LED lamp 10 turns on when the visibility of rearview mirror apparatus 1 is needed rather than in normal driving. Thus, the interconnection of electrical circuit to the circuit boards 14A, 14B is laid such that the LED lamp 10 turns on in conjunction with any one (or all) of blinker lamp, parking lamp etc. Alternatively, a circuit composition may be provided such that the LED lamp 10 is manually turned on by the driver. The color of light radiated from the LED lamp 10 is amber series and such amber series light can be obtained by combining the colors of LED's 11A, 11B and cover 13.

Therefore, the color combination can be any one of:

(1) combination of amber series emission light from LED'S 11A, 11B and transparent or semi-transparent and colorless cover 13;

(2) combination of white series emission light from LED's 11A, 11B and transparent or semi-transparent and amber series color cover 13; and (3) combination of amber series emission light from LED's 11A, 11B and transparent or semi-transparent and amber series color cover 13.

The reflector 12 is formed by resin molding such that light laterally radiated from LED's 11A, 11B is reflected in the direction of optical axis. It has two mirror surfaces 12A, 12B at the respective center of which LED's 11A, 11B are disposed. The mirror surfaces 12A, 12B are mirror-finished or pearskin-finished. The cover 13 is formed by molding transparent or semi-transparent resin such that it has a predetermined strength and cover property. Meanwhile, it is necessary that the radiation angle of LED lamp 10 satisfies a government regulation and that, especially, lighting to the back side of vehicle secures a predetermined value or more of light intensity. Therefore, the mirror surface 12B is provided with such a inclined surface that reflects light emitted from LED 11B to the back of vehicle or with such a cutting region in the mirror surface 12B that radiates light emitted from LED 11B directly to the back of vehicle without reflecting it.

The circuit boards 14A, 14B are provided with the sockets 15A, 15B which are each disposed in holes 12a of the reflector 12 and into which LED's 11A, 11B are each inserted.

The circuit boards 14A, 14B are composed of printed boards 16A, 16B having a wiring pattern for the electrical connection with LED's 11A, 11B, and cases 17A, 17B which is formed by insert molding and to which a plurality of boards to compose the printed boards 16A, 16B can be bonded.

The printed boards 16A, 16B are connected with a wire harness which is cabled from fuse box, distributor or switch equipped in the automobile 20.

Figure 24:
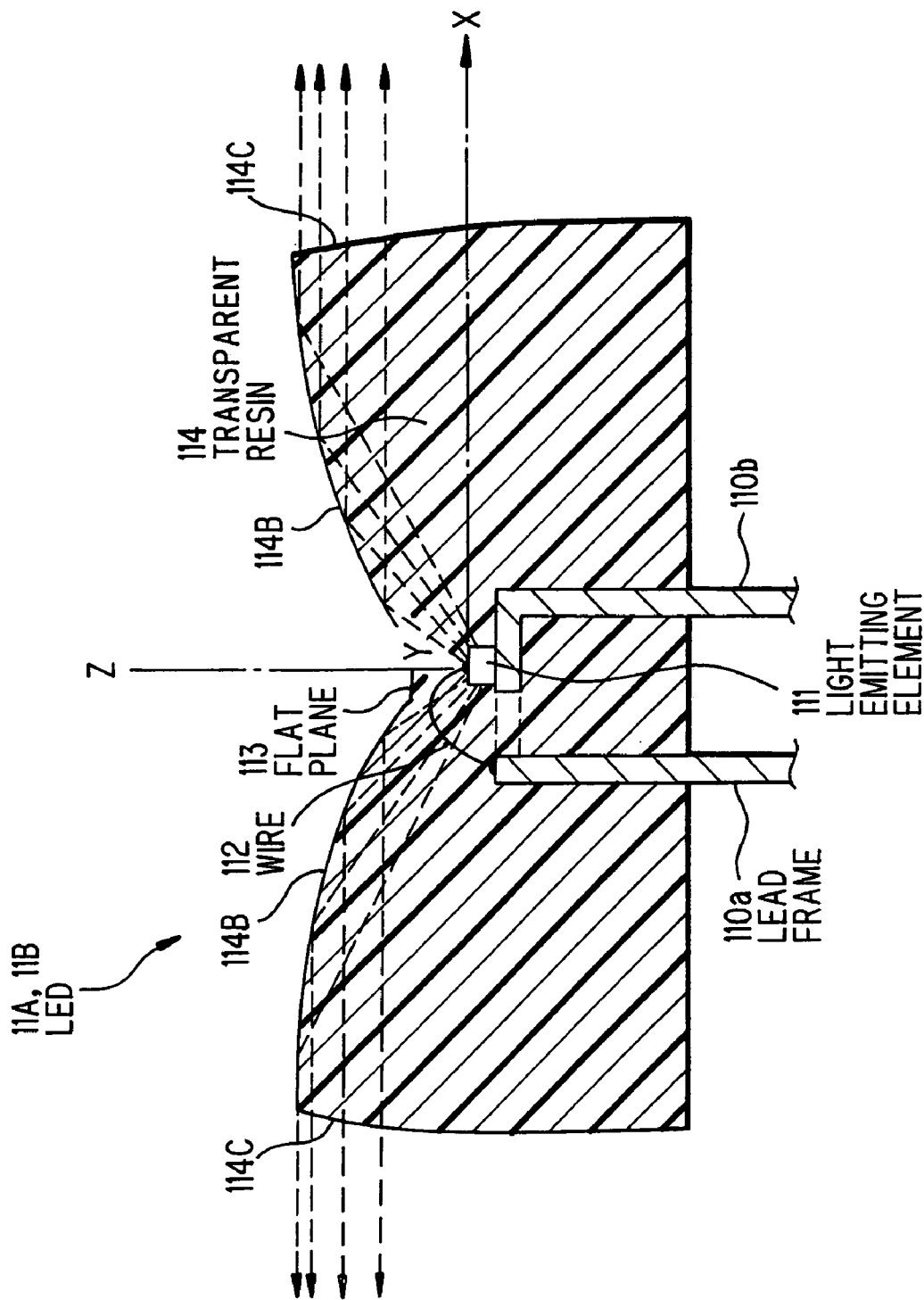
FIG. 24 is an enlarged vertical cross sectional view showing LED 11A or 11B in FIG. 22.

FIG. 24 is an enlarged vertical cross sectional view showing LED 11A or 11B in FIG. 22.

LED's 11A, 11B each are composed of: a pair of lead frames 110a, 110b that are disposed through a gap for insulation on X-Y plane; a light emitting element 111 that is mounted on the origin-point position of the lead frame 110b, which is made by bending a strip plate into L-shape; a wire 112 to electrically connect the top-face electrode of light emitting element 111 to the tip of lead frame 110a; and transparent epoxy resin 114, which is shaped like a flat column, to seal the lead frames 110a, 110b, light emitting element 111 and wire 112.

The transparent epoxy resin 114 is composed of a flat plane 113 which is formed just over the light emitting element 111, a reflection surface 114B which is shaped like an arc and continuously extends from the flat plane 113 to the side direction, and a side radiation surface 114C.

The reflection surface 114B is formed like an umbrella by rotating part of a parabola, which has a focal point at the center of emission surface of light emitting element 111 and is symmetrical to X-axis, around Z-axis in a range of within 60 or more degrees from Z-axis.

With LED's 11A, 11B such composed, light radiating from the light emitting element 111 is reflected on the reflection surface 114B and, thereby, it can be effectively radiated in the lateral direction vertical to the central axis of light emitting element 111. By attaching LED's 11A, 11B to the reflector 12, light radiated laterally from the light emitting element 111 is reflected by the reflector 12. Thus, light of LED's 11A, 11B can be radiated in the wider range and therefore the visibility can be enhanced. Meanwhile, light heading to the optical axis direction of light emitting element 111 is directly radiated transmitting through the flat plane 113.

Figure 25:
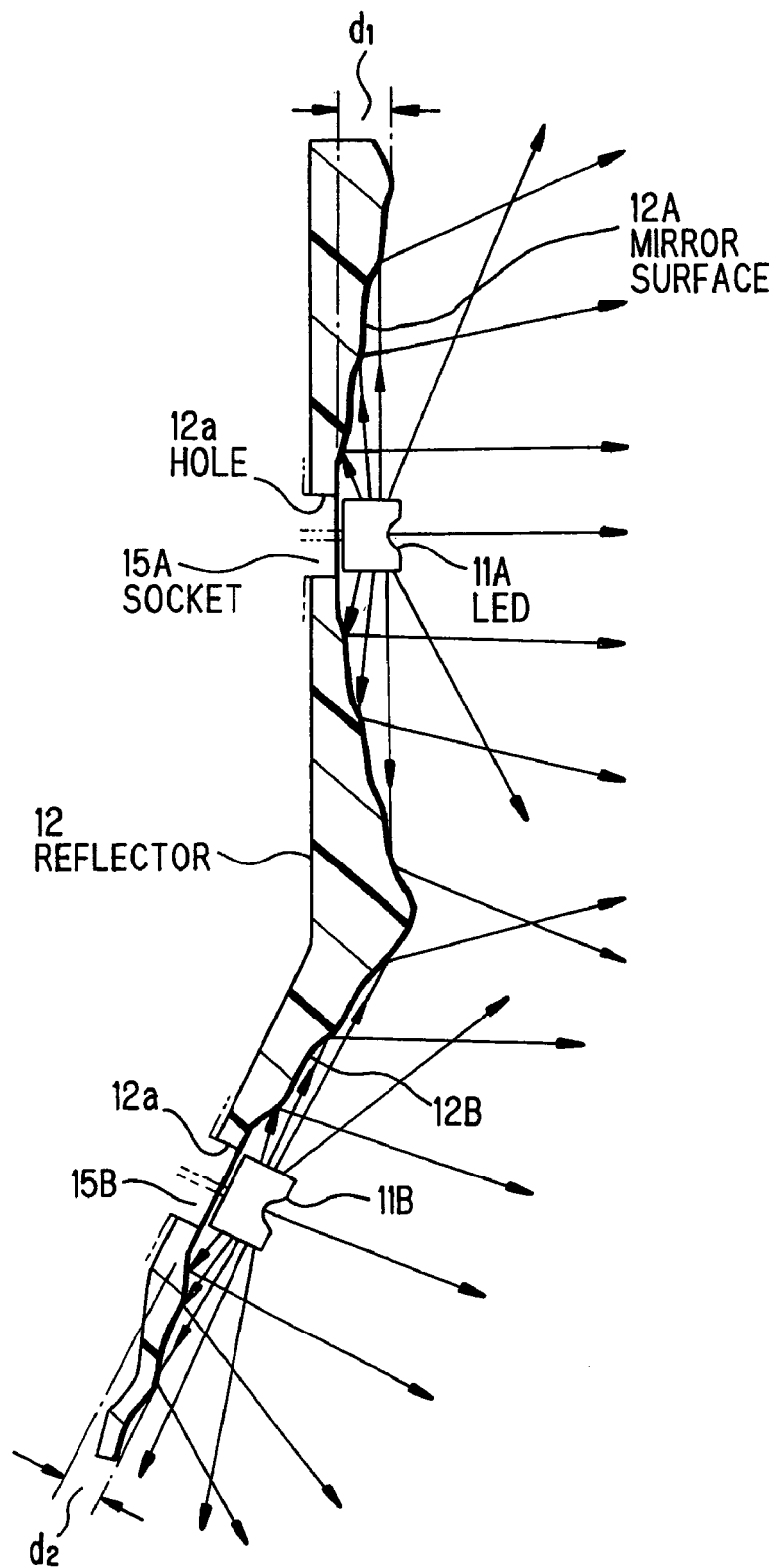
FIG. 25 is an enlarged cross sectional view showing reflector 12 in FIG. 22.

FIG. 25 shows the detailed composition of reflector 12.

The reflector 12 is a reflection member with concave face and is composed of a plurality of mirror facets which are radially disposed to LED's 11A, 11B. The mirror surface 12B has a very short depth (thickness) $d_2$ so as to radiate directly to the back of vehicle. The reason why the mirror surfaces 12A, 12B can be such shaped is using plane radiation type LED's 11A, 11B that the light radiation direction is not vertical but lateral. LED with such radiation characteristics can be provided by devising the shape of resin mold to seal the light emitting element and the light distribution of light emitting element. Although a bullet lens type is known as the shape of resin mold, it may be modified into such a shape that light radiated from the light emitting element can be reflected or refracted in the horizontal direction.

By combining the plane radiation type LED's 11A, 11B and the reflector 12 with mirror surfaces 12A, 12B having a large curvature radius, the range of light radiation can be significantly wider even when using only one LBO. Therefore, the number of LED's used can be reduced. Furthermore, the circuit board 14A, 14B can be downsized and the reflector 12 can be thinned. Hence, the occupied space of LED lamp 10 can be reduced not to affect the deposition of mirror 4 and mirror support member.

In operation, when power is supplied to LED's 11A and 11B, LED's 11A and 11B emits light. As shown in FIG. 25, light emitted from LED 11A is radiated to all directions (radius directions) of 360° from the center of mirror surface 12A, reflected on the mirror surface 12A in the direction of arrows in FIG. 25. In like manner, light emitted from LED 11B is radiated to all directions from the center of mirror surface 12B, reflected on the mirror surface 12B in the direction of arrows in FIG. 25. Also, part of light from LED 11B is radiated directly to the side or back of vehicle without being reflected on the mirror surface 12B. Light reflected on the mirror surfaces 12A, 12B is transmitted through the cover 13, then radiated to the front and side of automobile 20.

Thus, by using the LED lamp 10, the wide lighting range can be secured with a minimum number of light sources. The power consumption can be reduced and the product cycle can be elongated. Also, the overheat of housing 2 can be prevented by using LED as light source. Further, since light effectively radiated laterally from the plane radiation type LED's 11A, 11B can be optically controlled to be radiated in the desired direction by the reflector 12, light intensity to the back of vehicle can be secured. Therefore, the power consumption can be reduced while removing the unnecessary light source.

The shape of mirror surfaces 12A, 12B is not limited to a radial type shown in FIG. 22 and, instead, may be shaped like paraboloid or Fresnel lens. The cover 13 has a flat inner surface and, instead, its inner surface may be provided with a diffusion surface such as pyramid unevenness, pearskin-finish, blast treatment etc. By the diffusion surface, lighting unevenness can be improved and the appearance can be improved because the interior of LED lamp 10 is kept from eyes. Further, the cover 13 may be provided with fluorescent coating or reflection film on the circumference. The cover 13 may be a lens to diffuse light.

By mirror-finishing the inner surface of the housing 2 at the portion to house the LED lamp 10, light from LED's 11A, 11B can be more efficiently extracted outside.

Although in the first embodiment the rearview mirror apparatus 1 is applied to four-wheel automobiles, it may be applied to a variety of vehicles such as motorcycles, side cars, special-purpose vehicles. In case of automobile, the rearview mirror apparatus 1 can be applied to a fender mirror other than the door mirror shown in FIG. 21. In this case, the same effect as the door mirror can be obtained.

Although in the first embodiment the cover 13 is provided on the front side of reflector 12, part of housing 2 facing the reflector 12 may function as the cover 13. Namely, that part of housing 2 may be transparent or semi-transparent and other part may have the same color as the car body. In such a composition, the sense of integration between housing 2 and LED lamp 10 can be enhanced.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A rearview mirror apparatus for a vehicle, comprising:
   a housing that includes a mirror disposed on a back side of the housing;
   a light-emitting diode (LED) that includes a light emitting element and that plane-radiates light in a direction nearly perpendicular to the optical axis of the light emitting element; and
   a light guiding member that is attached to the housing such that the light guiding member is exposed in an opening formed at part of the outer surface of the housing;
   wherein the light guiding member comprises a hole to fit the LED individually, the LED being received in the hole, so that the light guiding member allows light plane-radiated from the LED to be transmitted through the light guiding member and to be reflected on a light guiding member inner surface to be radiated in a desired direction.

2. The rearview mirror apparatus according to claim 1, wherein:
the light guiding member has one end that is extended near the mirror on the back side of the housing.

3. The rearview mirror apparatus according to claim 1, wherein:
the housing is attached to a door or an engine hood of the vehicle, or to a motorcycle as the vehicle.

4. The rearview mirror apparatus according to claim 1, wherein:
the LED emits amber or white light.

5. The rearview mirror apparatus according to claim 1, wherein:
the LED is turned on in conjunction with a blinker lamp and/or parking lamp.

6. The rearview mirror apparatus according to claim 1, wherein:
the LED is fitted into the light guiding member.

7. The rearview mirror apparatus according to claim 1, wherein:
the light guiding member has a thickness; and
an emission point of the LED is located at a middle of the thickness of the light guiding member.

8. The rearview mirror apparatus according to claim 1, wherein:
the light guiding member is composed of a front face formed along the outer shape of the housing and a back face opposite to the front face, the back face being provided with a step portion to diffuse light radiated from the LED.

9. The rearview mirror apparatus according to claim 8, wherein:
the step portion functions as a reflection surface that reflects light radiated from the LED or light reflected on at least part of the front face and back face of the light guiding member in a desired direction to allow the light to be externally radiated from the front face of the light guiding member.

10. The rearview mirror apparatus according to claim 8, wherein:
the LED is disposed between the front face and back face of the light guiding member and near the outer edge of the housing.

11. The rearview mirror apparatus according to claim 8, wherein:
the light guiding member has a V-shaped notch on the back face, the notch serving to diffuse light radiated from the LED.

12. A rearview mirror apparatus for a vehicle, comprising:
a housing that includes a mirror disposed on a back side of the housing;
a light-emitting diode (LED) that includes a light emitting element and that radiates light in an optical axis direction of the light emitting element and in a direction nearly perpendicular to the optical axis direction of the light emitting element; and
a reflector that is disposed along the shape of the housing at part of the outer surface of the housing and that comprises at least one concave reflection surface which allows light plane-radiated from the LED disposed at a center of the concave reflection surface to be reflected in the front or side direction of the vehicle.

13. The rearview mirror apparatus according to claim 12, wherein:
the reflector has two reflection surfaces for forward lighting and for sideward lighting.

14. The rearview mirror apparatus according to claim 12, wherein:
the housing is attached to a door or an engine hood of the vehicle, or to a motorcycle as the vehicle.

15. The rearview mirror apparatus according to claim 12, wherein:
the LED emits amber or white light.

16. The rearview mirror apparatus according to claim 12, wherein:
the LED is turned on in conjunction with a blinker lamp and/or parking lamp.

17. The rearview mirror apparatus according to claim 12, wherein:
the LED is disposed inside the housing such that light radiated from the light emitting element is directly radiated to the back of the vehicle.

18. The rearview mirror apparatus according to claim 12, wherein:
the reflector has a partially reduced thickness such that light radiated from the light emitting element is directly radiated to the back of the vehicle.

19. The rearview mirror apparatus according to claim 12, wherein:
the reflector has a cover on its front face.

20. The rearview mirror apparatus according to claim 19, wherein:
the cover has a diffusion surface to diffuse incident light on its inner surface.

21. The rearview mirror apparatus according to claim 19, wherein:
the cover is transparent or semi-transparent and is colored in amber or colorless.

22. A rearview mirror apparatus for a vehicle, comprising:
a housing that includes a mirror disposed on a back side of the housing;
at least one light-emitting diode (LED) that includes a light emitting element and plane-radiates light in a direction nearly perpendicular to the optical axis of the light emitting element; and
a light guiding member attached to the housing such that it is exposed in an opening formed at part of the outer surface of the housing,
wherein the light guiding member comprises a hole to fit the LED individually, the LED being received in the hole, so that the light guiding member allows light plane-radiated from the LED to be transmitted through the light guiding member and to be reflected on an inner surface of the light guiding member to be radiated in a desired direction.

23. The rearview mirror apparatus according to claim 22, wherein:
the light guiding member has a thickness, and
an emission point of the at least one LED is located at a middle of the thickness of the light guiding member.

* * * * *

UNITED STATES PATENT AND TRADEMARK OFFICE
CERTIFICATE OF CORRECTION

PATENT NO. : 7,334,923 B2  Page 1 of 1
APPLICATION NO. : 10/813633
DATED : February 26, 2008
INVENTOR(S) : Yoshiharu Tanaka et al.

It is certified that error appears in the above-identified patent and that said Letters Patent is hereby corrected as shown below:

Title page, item (30)
insert as follows: Foreign Application Priority Data

| Mar. 31, 2008 | (JP) | 2003-096752 |
| Mar. 31, 2003 | (JP) | 2003-096757 |
| Mar. 16, 2004 | (JP) | 2004-073865 |

Signed and Sealed this

Seventeenth Day of June, 2008

JON W. DUDAS
*Director of the United States Patent and Trademark Office*